United States Patent
Aruga et al.

(10) Patent No.: US 8,519,874 B2
(45) Date of Patent: Aug. 27, 2013

(54) SUCCESSIVE APPROXIMATION A/D CONVERTER

(75) Inventors: Kenta Aruga, Yokohama (JP); Suguru Tachibana, Yokohama (JP); Sanroku Tsukamoto, Kawasaki (JP); Koji Okada, Kasugai (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 18 days.

(21) Appl. No.: 13/186,059

(22) Filed: Jul. 19, 2011

(65) Prior Publication Data
US 2012/0075128 A1  Mar. 29, 2012

(30) Foreign Application Priority Data
Sep. 29, 2010  (JP) .................... 2010-219084

(51) Int. Cl.
H03M 1/10  (2006.01)
H03M 1/14  (2006.01)

(52) U.S. Cl.
CPC ............ *H03M 1/1038* (2013.01); *H03M 1/144* (2013.01)
USPC .......................................... 341/120; 341/172

(58) Field of Classification Search
USPC .......................................... 341/118, 120, 172
See application file for complete search history.

(56) References Cited

U.S. PATENT DOCUMENTS

| | | | |
|---|---|---|---|
| 6,714,151 B2 | 3/2004 | Tachibana et al. | |
| 6,867,723 B1 | 3/2005 | Tachibana et al. | |
| 6,985,101 B2 | 1/2006 | Leung et al. | |
| 7,199,745 B2 | 4/2007 | Tachibana et al. | |
| 7,233,273 B2 | 6/2007 | Tachibana et al. | |
| 7,755,521 B1 * | 7/2010 | Kuramochi et al. | 341/118 |

(Continued)

FOREIGN PATENT DOCUMENTS

| | | | |
|---|---|---|---|
| JP | 58-051612 A | 3/1983 | |
| JP | 59-083418 A | 5/1984 | |

(Continued)

OTHER PUBLICATIONS

Tsukada et al., High-Accuracy MOS A/D Converter with InherentSelf-Compensation, UDC 681.335.2:621.3.049.774.2 Electronics and Communications i n Japan, vol. 67-C, No. 1, 1984 Translated from Denshi Tsushin Cakkai Ronbunshi, vol. 66-C, No. 11, Nov. 1983, pp. 797-804; downloaded via: http://onlinelibrary.wiley.com/doi/10.1002/ecja.4400670111/abstract.*

(Continued)

*Primary Examiner* — Howard Williams
(74) *Attorney, Agent, or Firm* — Arent Fox LLP

(57) ABSTRACT

A successive approximation A/D converter, has a main DAC having a capacitive element group coupled to a top node and a switch group; a comparator comparing voltage of the top node with comparison reference voltage; a correction DAC generating correction voltage in accordance with a capacitance error of a capacitive element pair to be balanced in the main DAC, and supplying the correction voltage to the top node; and a control circuit generating internal digital input for controlling the switch group and a correction code for controlling the correction voltage, and outputting a successive approximation result by the comparator when the A/D conversion is performed. The control circuit measures a capacitance error of the capacitive element pair to be balanced, and determines an offset-removed capacitance error where an offset generated in the measurement is removed from the capacitance error.

9 Claims, 16 Drawing Sheets

(56) References Cited

U.S. PATENT DOCUMENTS

| | | | |
|---|---|---|---|
| 2009/0121907 A1* | 5/2009 | Kuramochi et al. | 341/120 |
| 2010/0001892 A1 | 1/2010 | Aruga et al. | |
| 2011/0122006 A1* | 5/2011 | Liao et al. | 341/120 |

FOREIGN PATENT DOCUMENTS

| | | | |
|---|---|---|---|
| JP | 59-133728 | A | 8/1984 |
| JP | 64-077322 | A | 3/1989 |
| JP | 07-086947 | A | 3/1995 |
| JP | 2000-031824 | A | 1/2000 |
| JP | 2004-032089 | A | 1/2004 |
| JP | 2004-080075 | A | 3/2004 |
| JP | 2004-200926 | A | 7/2004 |
| JP | 2005-086550 | A | 3/2005 |
| JP | 2007-049637 | A | 2/2007 |
| JP | 2007-142863 | A | 6/2007 |
| JP | 2009-232281 | A | 10/2009 |

OTHER PUBLICATIONS

Toshiro Tsukada et al., "High-Accuracy MOS A/D Converter with Inherent Self-Compensation", 1983, vol. J66-C, No. 11, pp. 797-804.

Toshiro Tsukada et al., "An Automatic Error Cancellation Technique for Higher Accuracy A/D Converters", IEEE Journal of Solid-State Circuits, Apr. 1984, vol. SC-19, No. 2, pp. 266-268.

Hae-Seung Lee et al., "Self-Calibration Technique for A/D Converts", Mar. 1983, vol. CAS-30, No. 3, pp. 188-190 IEEE.

Hae-Seung Lee et al., "A Self-Calibrating 15 Bit CMOS A/D Converter", IEEE Journal of Solid-State Circuits, Dec. 1984, vol. SC-19, No. 6, pp. 813-819.

Hae-Seung Lee et al., "Accuracy Considerations in Self-Calibrating A/D Converters", IEEE Transactions on Circuits and Systems, Jun. 1985, vol. CAS-32, No. 6, pp. 590-597.

Ka Y. Leung et al., "A Dual Low Power ½ LSB INL 16b/1Msample/s SAR A/D Converter with on-chip Microcontroller", Asian Solid-State Circuits Conference, Digest of Technical papers, 2006, pp. 51-54 IEEE.

* cited by examiner

SUCCESSIVE APPROXIMATION A/D CONVERTER

CROSS-REFERENCE TO RELATED APPLICATION

This application is based upon and claims the benefit of priority of the prior Japanese Patent Application No. 2010-219084, filed on Sep. 29, 2010, the entire contents of which are incorporated herein by reference.

FIELD

The embodiment of the present invention relates to a successive approximation A/D converter.

BACKGROUND

Characteristics of a successive approximation analog/digital converter (A/D converter) are that circuit configuration is relatively simple, compatibility with CMOS processing is high, manufacturing cost is relatively low, and conversion time can be relatively short. Due to this, a successive approximation A/D converter is used in various applications. In concrete terms, a successive approximation A/D converter is used as an A/D conversion circuit which is built in to a microcontroller (MCU).

A successive approximation A/D converter has a sampling circuit which samples analog voltage, a digital/analog converter (DAC) which generates internal analog voltage, a comparator which compares sampling voltage and internal analog voltage, and a control circuit having a successive approximation register for storing a comparison result of the comparator. In other words, the successive approximation A/D converter samples analog voltage, operates an input digital code of the DAC so that the sampled voltage and the output voltage of the internal DAC become the closest, and outputs a final DAC input code as the digital signal. In the successive approximation, binary search is performed, where operation to generate intermediate reference voltage in a block including analog voltage by the internal DAC is repeated.

The successive approximation A/D converter has a main DAC and a sub-DAC, in order to decrease a size of a capacitive element (capacitor) of the DAC. For example, in the case of A/D conversion of M+N bits, the significant M bits are determined by the main DAC, and the insignificant N bits are determined by the sub-DAC. Such a successive approximation A/D converter is written in patent documents like, Japanese Patent Application Laid-Open No. 2004-32089, No. 2004-80075, No. 2004-200926, No. 2005-86550, No. 2007-49637, No. 2007-142863 and U.S. Pat. Nos. 6,714,151, 6,867,723, 7,199,745, and 7,233,273.

The successive approximation A/D converter also has a correction DAC or a correction capacitive element (adjustment capacitive element) for correcting the manufacturing dispersion of the capacitance element (capacitor) of the DAC. Using the correction DAC and the adjustment capacitive element, conversion errors due to the manufacturing dispersion of the capacitive element of the DAC are suppressed. Such a self-correcting successive approximation A/D converter is disclosed in patent documents like, Japanese Patent Application Laid-Open No. S59-83418, No. S59-133728, U.S. Pat. No. 6,985,101, Japanese Patent Application Laid-Open No. 2009-232281, and non-patent documents like, Toshiro Tsukada, Katsuaki Takagi, Yuzo Kida, Minoru Nagata "Self-calibrating high precision MOS, A/D Converter", IEICE Transactions (C) Vol. 66, No. 11, 1983; T. Tsukada, K. Takagi, Y. Kita, M. Nagata, "An automatic error cancellation techniqure for higher accuracy A/D converters", IEEE J. Solid-State Circuits, vol. SC-19, No. 2, 1984; H. S. Lee, D. A. Hodges, "Self-Calibration technique for A/D converters", IEEE Transactions on Circuits and Systems, Vol. CAS-30, No. 3, March, 1983; H. S. Lee, D. A. Hodges, "A Self-Calibrating 15 Bit CMOS A/D Converter", IEEE Journal of Solid-State Circuits Vold SC-19, No. 6, December 1984; H. S. Lee, D. A. Hodges,"Accuracy Considerations in Self-Calibrating A/D Converters",IEEE Transactions on Circuits and Systems Vol. 2 CA S-32, No. 6, June 1985; Ka Y. Leung, Kafai Leung, Douglas R. Holberg, "A Dual Low Power 1/2LSB INL 16b/1Msample/s SAR A/D Converter with on-chip Microcontroller", Asian Solid-State Circuits Conference, Digest of Technical papers, 2006.

A self correcting successive approximation A/D converter detects error voltage between two states where the correction target capacity elements are balanced in the top node of the main DAC, which is an input of a comparator, and a correction code is determined corresponding to the error voltage. Then according to the correction code, the output voltage of the correction DAC is corrected or the capacitance of the adjustment capacitive element is adjusted according to the correction code.

An error occurs between these two states because of the offset voltage due to the ON/OFF operation of a switch element disposed in the comparator, and the offset voltage of the comparator voltage. The offset voltage causes a drop in correction accuracy.

SUMMARY

The first aspect of the embodiment is a successive approximation A/D converter, has a main DAC having a capacitive element group of which one electrode is coupled to a top node and is weighted with a power of 2, and a switch group by which the other electrode of the capacitive element group is coupled to an analog input terminal upon sampling, or is coupled to either a first reference voltage or a second reference voltage upon A/D conversion; a comparator which compares voltage of the top node of the main DAC with comparison reference voltage; a correction DAC which generates correction voltage in accordance with a capacitance error of a capacitive element pair to be balanced among the capacitive element group of the main DAC, and supplies the correction voltage to the top node of the main DAC; and a control circuit which generates internal digital input for controlling the switch group of the main DAC and a correction code for controlling the correction voltage of the correction DAC, and outputs a successive approximation result by the comparator from a significant bit to an insignificant bit when the A/D conversion is performed, wherein the control circuit measures a capacitance error of the capacitive element pair to be balanced by performing switching control on the internal digital input corresponding to the capacitive element pair to be balanced, and determines an offset-removed capacitance error where an offset generated in the measurement based on the switching control is removed from the capacitance error.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE PREFERRED EMBODIMENTS

Figure 1:
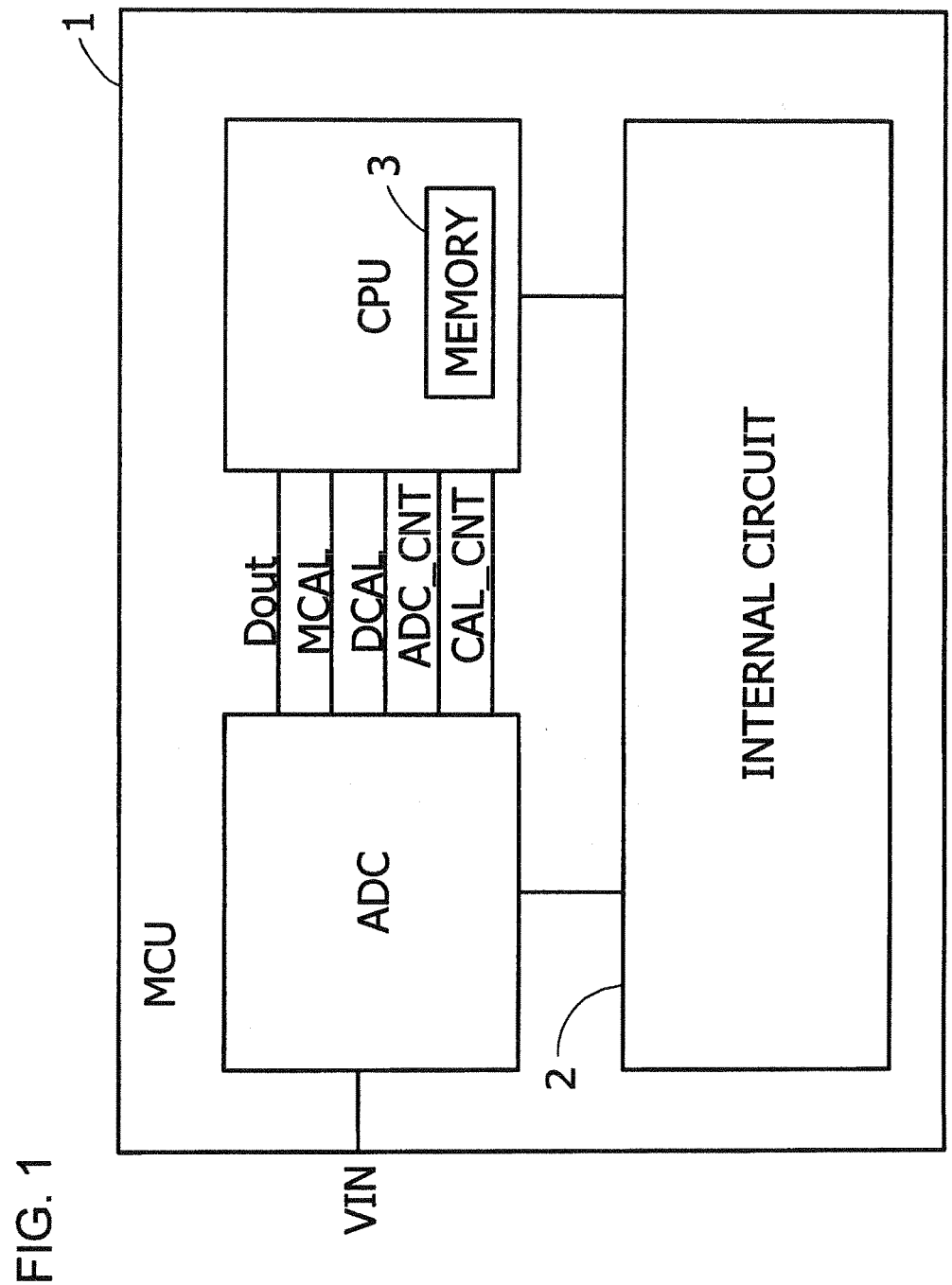
FIG. 1 illustrates an example of a micro-control unit 1 enclosing an A/D converter.

FIG. 1 illustrates an example of a micro-control unit 1 enclosing an A/D converter. The micro-control unit 1 has an A/D converter ADC which converts analog voltage Vin into a digital signal Dout, a CPU which inputs a digital signal Dout converted by the A/D converter ADC and performs predetermined processing, and an internal circuit 2, such as a peripheral resource circuit. Responding to an A/D conversion control signal ADC_CNT from the CPU, the A/D converter ADC converts the analog signal VIN into the digital signal Dout.

The A/D converter ADC has a correction DAC and a correction capacitive element (adjustment capacitive element) for suppressing conversion errors. Responding to a correction control signal CAL_CNT from the CPU, the A/D converter ADC performs a predetermined error measurement operation, and outputs a measured correction code MCAL. The CPU generates a correction code DCAL for the A/D conversion, based on the measured error code MCAL, and stores the correction code DCAL in a memory 3, or the like. The CPU supplies the correction code DCAL to the A/D converter ADC when necessary during A/D conversion.

The A/D converter ADC may compute the correction code DCAL used for conversion from the measured error code MCAL, and store the correction code DCAL in memory.

Now the successive approximation A/D converter is described in sequence, and then a successive approximation A/D converter according to the present embodiment will be described in detail.

Figure 2:
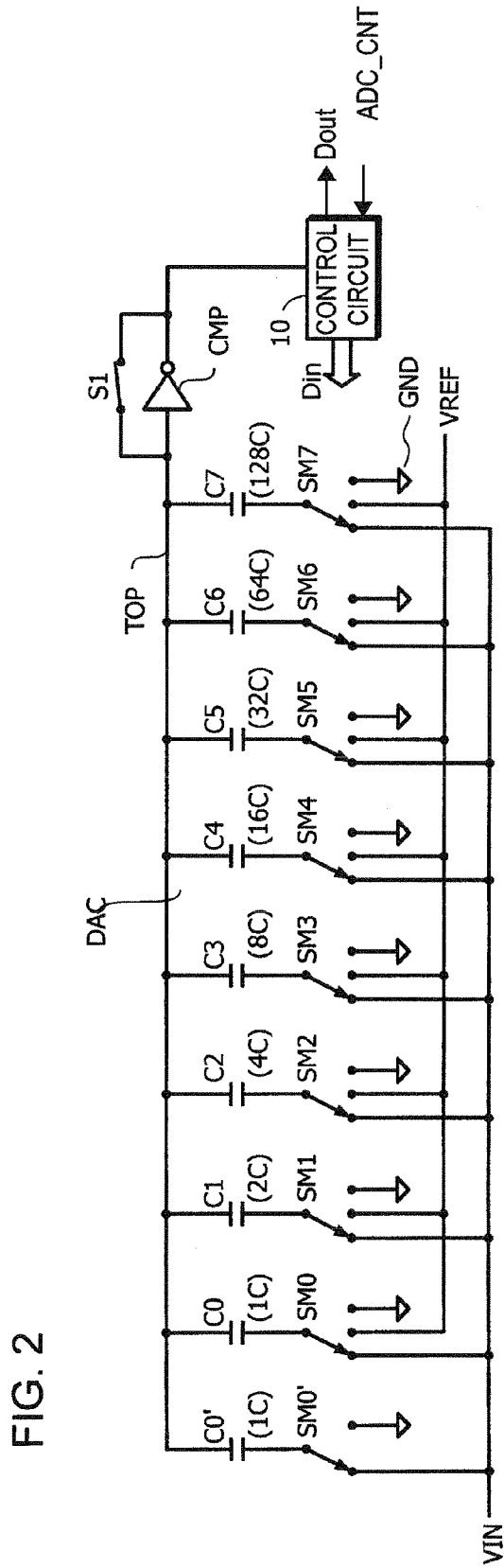
FIG. 2 is a critical diagram of an 8-bit successive approximation A/D converter.

FIG. 2 is a critical diagram of an 8-bit successive approximation A/D converter. The A/D converter converts analog voltage VIN into a digital signal Dout. The A/D converter has an internal DAC which samples the analog voltage VIN, and controls the voltage of a top node TOP according to an internal digital signal Din.

The internal DAC has a capacitive array constituted by a plurality of capacitive elements C0' and C0 to C7. A value depicted in ( ) of each capacitive element is a relative capacitance value 1C to 128C of the capacitive element, and the capacitance values of the capacitive elements are weighted with the ratio of a power of 2, that is, a binary ratio. The top electrodes of the plurality of capacitive elements C0' and C0 to C7 are commonly connected to the top node TOP, and the bottom electrodes thereof are connected to switches SM0' and SM0 to SM7 respectively.

The A/D converter also has a comparator CMP of which top node TOP is connected to the input, and a switch S1 which is disposed between the input and the output of the comparator CMP. The comparator CMP is an inverter. The A/D converter also has a control circuit 10, and the control circuit encloses a successive approximation resistor. Responding to an A/D conversion control signal ADC_CNT, the control circuit 10 performs successive approximation control by controlling the switches S1, SM0', and SM0 to SM7, tabulates the approximation result of the comparator CMP, and outputs the digital output Dout.

The switch SM0' can be connected either to an input terminal VIN or a ground GND, and the switches SM0 to SM7 can be connected to any of the input terminal VIN, the ground GND and the reference voltage VREF. The reference voltage VREF is a power supply voltage or a more stable internal reference voltage generated from the power supply voltage. For example, the ground GND is 0 V and the reference voltage VREF is 5 V. The analog voltage VIN to be input is a voltage between the reference voltage VREF and the ground GND.

The comparator CMP is a CMOS inverter of which power supplies are both the reference voltage VREF and the ground GND, and when the switch S1 is ON, the input/output terminals are short circuited, and the top node TOP has threshold voltage Vt of the comparator CMP, such as VREF/2 voltage.

Now operation of the successive approximation A/D converter in FIG. 1 will be described. First upon sampling, the switch S1 of the comparator is turned ON, and the switches SM0' and SM0 to SM7 of the bottom node of the capacitive array are connected to the input terminal VIN. In this state, the potential of the top node TOP becomes the threshold voltage Vt (=VREF/2) of the comparator CMP, and the input voltage VIN is applied to the bottom node of the capacitive array. Then in accordance with the voltage difference of the input voltage VIN and the threshold voltage VREF/2, electric charges are charged to each capacitive element of the capacitive array.

After the time required for sampling elapses, the switch S1 of the comparator is turned OFF, to set the top node TOP to the floating state. Then the electric charges, in accordance with the input voltage VIN, are stored and held in the capacitive array.

Then the control circuit 10 starts successive approximation. In order to determine the most significant bit, the control circuit 10 connects the switch SM7 to the reference voltage VREF side, and the switches SM0' and SM0 to SM6 to the ground GND side. Then the potential of the top node TOP, which is initially near the threshold voltage of the comparator CMP, falls if VIN>(VREF/2), or rises if VIN<(VREF/2). This rise or fall is determined by the comparator CMP, and the most significant bit is determined as "1" if fall occurs, or as "0" if rise occurs.

In other words, the capacitance value of the highest capacitor C7 is 128C, and the total capacitance value of the other capacitors C0' and C0 to C6 is also 128C, so connecting the switch SM7 to the reference voltage VREF side, and the switches SM0' and SM0 to SM6 to the ground GND side, is equivalent to the state where the voltage VREF/2 is applied to the bottom node of the capacitive array. Hence if the input voltage VIN is lower than the VREF/2, the potential of the top node TOP rises, and if the input voltage VIN is higher than VREF/2, the potential of the top node TOP falls. As a result, if the potential of the top node falls (VIN>(VREF/2)) in accordance with the determined result of the comparator CMP, the most significant bit is determined as "1", and if the potential rises (VIN<(VREF/2)), the most significant bit is determined as "0".

If the determined bit is "1", the switch SM7 is connected to the reference voltage VREF side, and if the determined bit is "0", the switch SM7 is connected to the ground GND side, and is fixed during successive approximation operation hereinbelow.

Then in order to determine the second most significant bit, the switches SM0' and SM0 to SM5 are maintained on the ground GND side, and the switch SM6 is connected to the reference voltage VREF side, and the comparator CMP determines whether the potential of the top node TOP is higher or lower than the threshold of the comparator CMP using the comparator CMP. If higher, the second bit is determined as "0", and if lower, the second bit is determined as "1".

In other words, the capacitance value of the second largest capacitor C6 is 64C, and the total capacitance value of the lower capacitors C0' and C0 to C5 is also 64C. Therefore if the switch SM6 is connected to the VREF side and the SM0' and SM0 to SM5 are connected to the GND side, this state is equivalent to the state of applying the voltage 3VREF/4 to the bottom node of the capacitive array if the switch SM7 is connected to the VREF side, or is equivalent to the state of applying the voltage VREF/4 to the bottom node of the capacitive array if the switch SM7 is connected to the GND side. In other words, the comparison operation for determining the second bit means determining whether the input voltage VIN is higher or lower than the voltage 3VREF/4, or determining whether the input voltage VIN is higher or lower than the voltage VREF/4.

Then according to the determined bit, the switch SM6 is connected to the reference voltage VREF side if the determined bit is "1", or connected to the ground GND side if the determined bit is "0", and this connection is fixed during the subsequent successive approximation operation.

By performing the above determination for the switches SM5 to SM0, thereafter 8-bit digital code, in accordance with the input voltage VIN, is obtained. The control circuit 10 outputs a value of each bit, based on the 8-bit determination result, as the digital output Dout.

In the above mentioned successive approximation A/D converter, the comparator CMP constituted by the inverter and the switch S1 may be replaced with a comparison circuit which compares threshold voltage Vt and a top node TOP, and a switch for connecting the top node TOP to the threshold voltage Vt. The reference voltage VREF and the ground GND may be the appropriate two reference voltages, VREF+ and VREF-, between the power supply voltage and the ground. This is the same for the A/D converter to be described hereinbelow.

Figure 3:
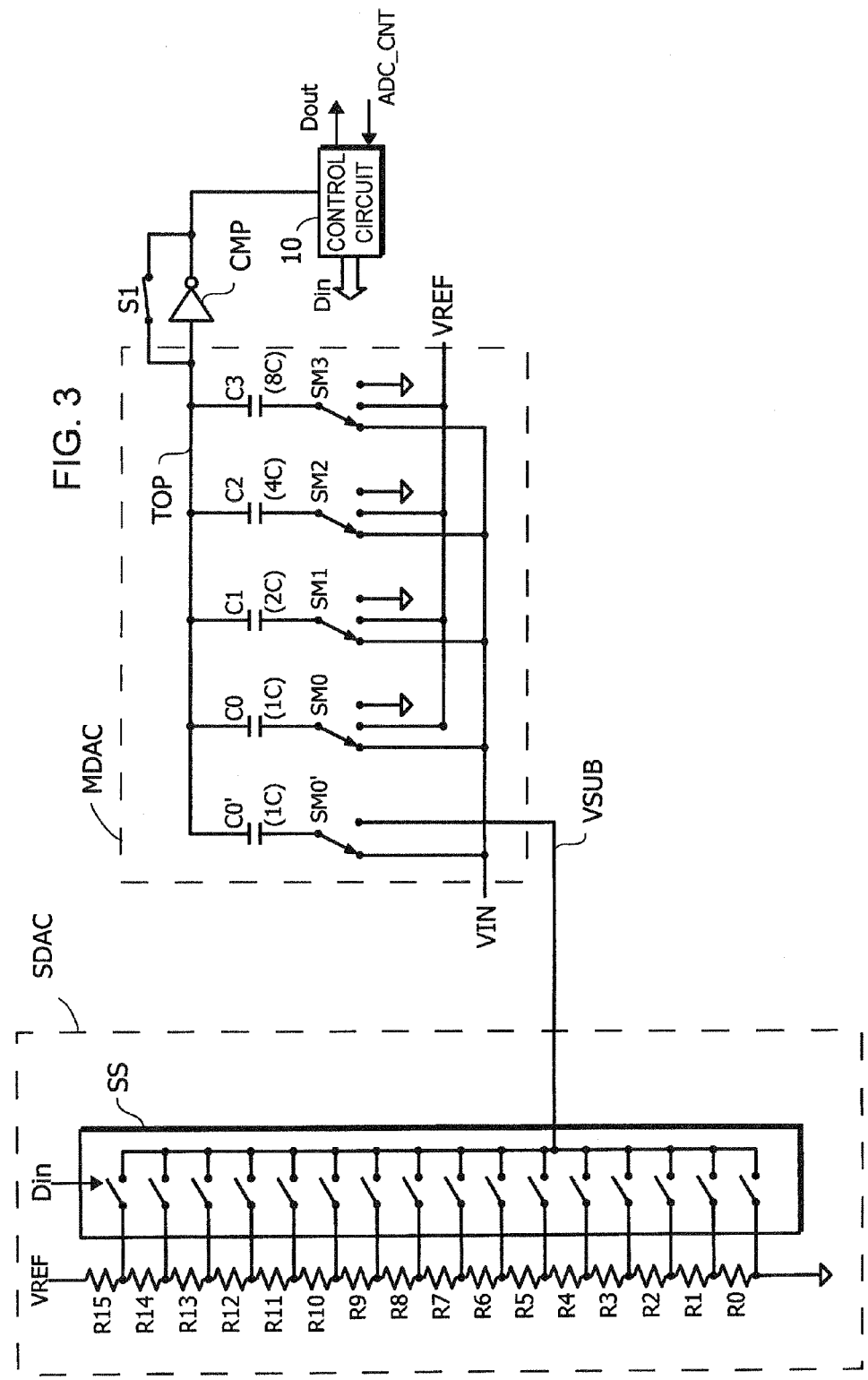
FIG. 3 is another circuit example of an 8-bit successive approximation A/D converter.

FIG. 3 is another circuit example of an 8-bit successive approximation A/D converter. Here the internal DAC of the capacitive array in FIG. 2 consists of a capacitive DAC (main digital analog converter MDAC) for a significant 4 bits and a resistive DAC (sub-digital analog converter SDAC) for an insignificant 4 bits. The rest of the configuration is the same as FIG. 2.

The 4-bit main DAC has capacitive elements C0', C0, C1, C2, C3 and switches SM0', SM0, SM1, SM2 and SM3. The switch SM0' of the capacitive element C0', which corresponds to the least significant bit of the main DAC (MDAC), is connected to either an input terminal VIN or an output terminal VSUB of the resistive DAC (SDAC). The other switches SM0 to SM3 are connected to one of the input terminal VIN, the reference voltage VREF and the ground GND.

The resistive DAC (SDAC), which is the 4-bit sub-DAC, has a resistive string constituted by resistive elements R0 to R15, and a selector switch group SS which is connected to the connection nodes of the resistive string. According to an internal digital signal Din from the control circuit 10, one of the selector switch group SS turns ON and voltage, according to the internal digital signal Din, is generated at an output terminal VSUB of the resistive DAC (SDAC).

In the successive approximation A/D conversion circuit in FIG. 3, values of significant 4 bits are determined in the same manner as FIG. 2. During this processing, the switch group SS is controlled so that the output terminal VSUB of the resistive DAC becomes 0 V. In other words, the control circuit 10 makes the lowest switch of the switch group SS being turned ON, and the rest of the switches being turned OFF to control the insignificant 4 bits of the internal digital signal Din.

Then in order to determine a value of the fifth most significant bit, the switch group SS is controlled so that the output terminal VSUB of the sub-DAC becomes VREF/2. The comparator CMP determines whether the potential of the top plate TOP is higher or lower than a threshold of the comparator CMP, and the fifth bit is determined as "0" if higher, and as "1" if lower.

Then in order to determine a value of the sixth most significant bit, an output terminal VSUB of the sub-DAC is set by controlling the switch group SS. In other words, the potential of the output terminal VSUB is set to (¼)*VREF if the fifth bit is "0", or to (¾)*VREF if the fifth bit is "1". Then the comparator CMP determines whether the potential of the top node TOP is higher or lower than the threshold of the comparator CMP, and the sixth bit is determined as "0" if higher, or as "1" if lower. By repeating the above operation until the least significant bit, an 8-bit digital code Dout, in accordance with the input voltage VIN, is obtained.

As FIG. 3 depicts, the required total capacitance value of the capacitive elements can be decreased from 256C to 16C by dividing the successive approximation A/D converter into the capacitive main DAC (MDAC) on the significant bit side, and the resistive sub-DAC (SDAC) on the insignificant bit side. Since the capacitive elements take up a relatively large area on the semiconductor integrated circuit substrate, the area on the substrate can be decreased by decreasing the total capacitance value of the capacitive elements.

Figure 4:
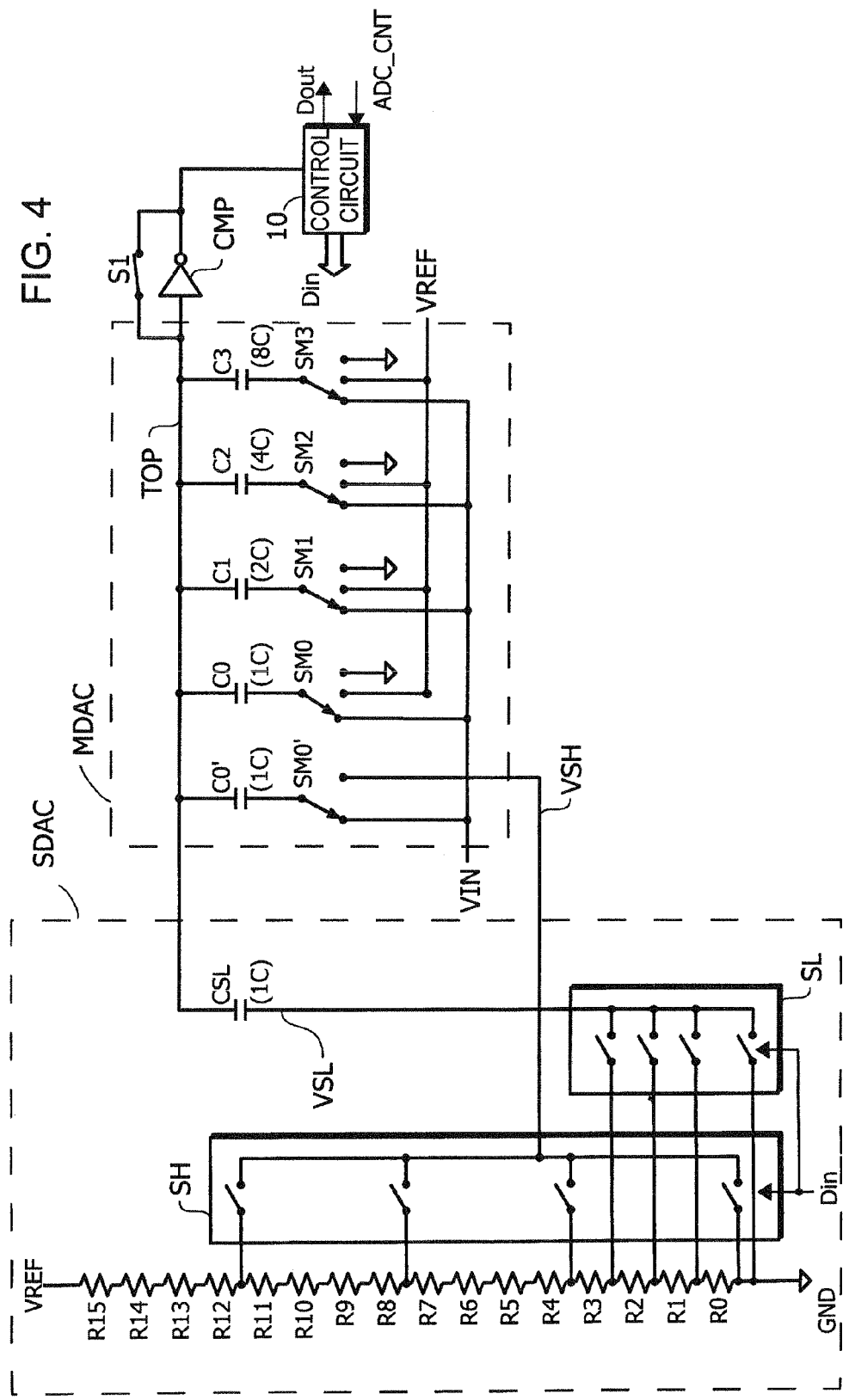
FIG. 4 is a variation circuit of the successive approximation A/D converter in FIG. 3.

FIG. 4 is a variation circuit of the successive approximation A/D converter in FIG. 3. This variation circuit is an example when 16 switches SS of the resistive DAC (SDAC) in FIG. 3 are divided into 4 switches SH which correspond to significant 2 bits, and 4 switches SL which correspond to insignificant 2 bits.

Due to this configuration, a capacitive element CSL having a same capacitance value as the capacitive element C0' of the least significant bit, among the capacitive elements of the capacitive main DAC (MDAC), is added. The voltage selected by the higher switch group SH in the resistive sub-DAC (SDAC) is output to the higher output terminal VSH, and is applied to the bottom node of the capacitive element C0' of the capacitive main DAC (MDAC). The voltage selected by the lower switch group is output to the lower output terminal VSL, and is applied to the bottom electrode of the capacitive element CSL.

In FIG. 4, four levels of voltage are output, with a (¼) *VREF interval, to the output terminal VSH, and four levels of voltage are output, with a (1/16)*VREF interval, to the output terminal VSL. In other words, the first resistive sub-DAC generates the significant 2 bits out of the 4 bits of the resistive sub-DAC (SDAC), and the second resistive sub-DAC generates the insignificant 2 bits thereof.

The successive approximation operation of the successive approximation A/D converter in FIG. 4 is approximately the same as that in FIG. 3. In the successive approximation operation after the sampling operation, the output terminals VSH and VSL of the resistive sub-DAC (SDAC) are controlled to the ground GND during significant 4 bits successive approximation. During the successive approximation of the insignificant 4 bits, 16 levels of voltage are applied to the bottom electrodes of the capacitive elements C0' and CSL by a combination of the voltage values of the output terminals VSH and VSL of the resistive sub-DAC (SDAC).

In the circuit in FIG. 4, a number of switches of the switch groups SH and SL in the resistive DAC (SDAC) can be decreased to ¼ of the number of switches of the switch group SS in FIG. 3. Therefore the parasitic capacitance by the switches can be decreased, a time constant of the output voltage of the output terminals VSH and VSL of the resistive DAC (SDAC) can be decreased, and the operation speed of the resistive DAC (SDAC) can be improved, and as a consequence, a faster A/D converter can be implemented compared with the circuit in FIG. 3.

In the above mentioned successive approximation A/D converter, an important factor to determine the A/D conversion characteristics is that the capacitance ratio of the capacitive elements C0' and C0 to C3 in the capacitive DAC (MDAC), which is the main DAC, is in an ideal 1C, 1C, 2C, 4C and 8C. If the relative accuracy of the capacitance value of this capacitor array is not high, a capacitance value mismatch occurs to the capacitive elements, and conversion accuracy drops, and the resolution of the A/D conversion decreases.

The capacitor array is designed to take measures as much as possible to accurately implement the relative capacitance ratio, such as disposing the capacitors to be point-symmetric, so as to withstand the linear inclination of the capacitance values, or disposing an extra element in a peripheral area expecting uniform etching. However, the capacitor array is disposed to be flat on the silicon substrate, so a perfectly ideal arrangement is impossible, and a systematic mismatch is generated. Furthermore, various random mismatches are generated due to the manufacturing steps during manufacturing.

As a result, in the case of the above mentioned A/D converter, a mismatch of the capacitive elements becomes a problem, and resolution becomes limited to 12 bits, for example. In order to implement higher resolution, such as a resolution higher than 14 bits, for example, a self-correcting function may be installed in the successive approximation A/D converter.

A successive approximation A/D converter having a self-correcting function has a correction DAC for correcting a mismatch of the capacitors, in addition to the DAC used for A/D conversion. Before starting the A/D conversion, a pair of capacitors, which are supposed to be balanced, are compared in the capacitive element group constituting the DAC used for the A/D conversion, and the degree of mismatch (error value) is measured by the correction DAC. In the middle of the A/D conversion, the correction DAC generates a correction value to cancel the error based on the previously measured error value, adds the correction value to the DAC used for the A/D conversion, and removes the error component of the A/D conversion due to the mismatch of the capacitors.

[First Embodiment]

Figure 5:
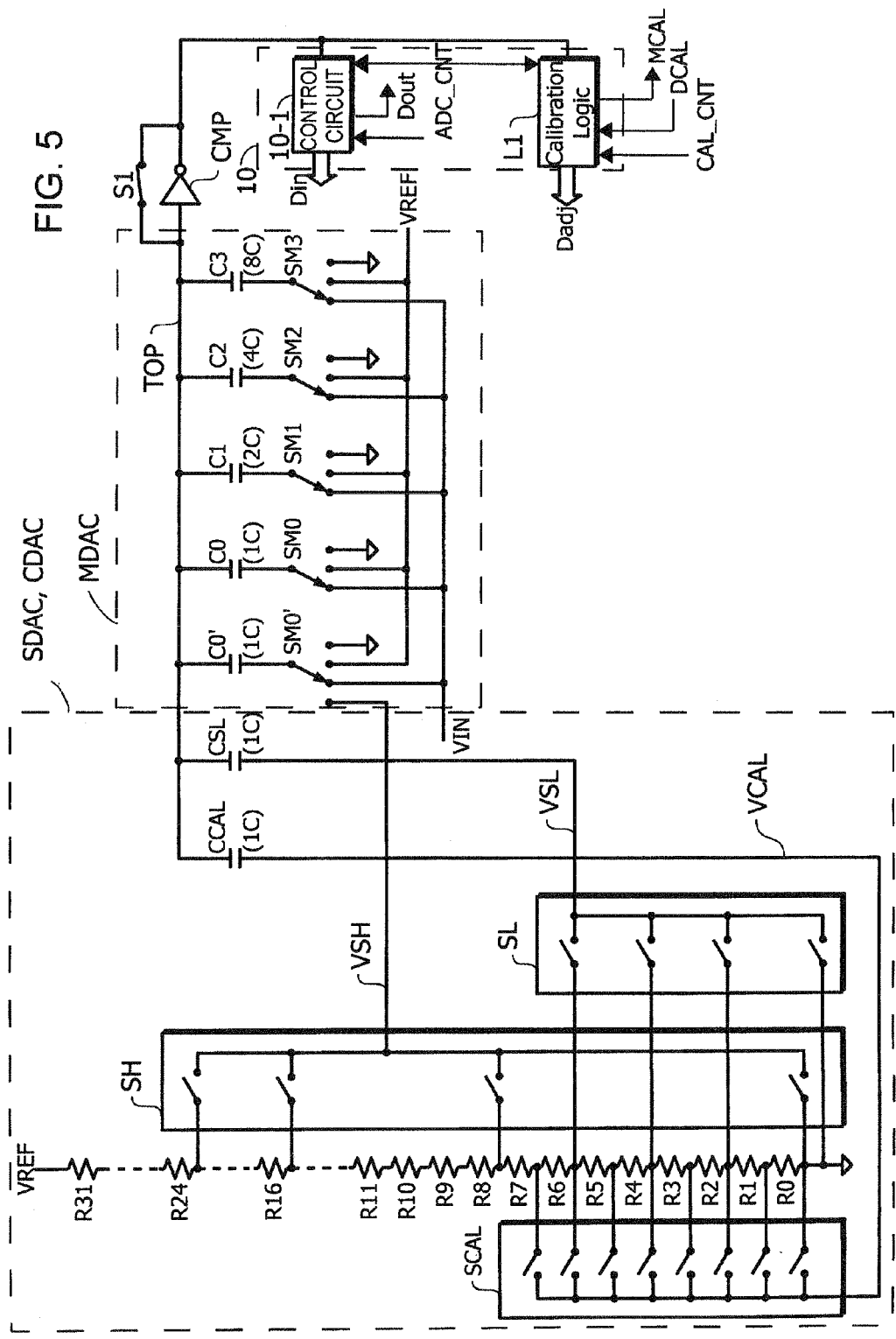
FIG. 5 is a circuit diagram of a self-correcting successive approximation A/D converter according to the present embodiment.

FIG. 5 is a circuit diagram of a self-correcting successive approximation A/D converter according to the present embodiment. The A/D converter in a high resolution region, which requires self-correction, has 14 bits or more, for example, but only 8 bits are depicted in FIG. 5 to simplify the drawing.

Just like the successive approximation A/D converter in FIG. 4, the successive approximation A/D converter in FIG. 5 has a capacitive main DAC (MDAC), a resistive sub-DAC (SDAC), a capacitor CMP, a switch S1 and a control circuit 10. The resistive sub-DAC (SDAC) has resistors R0 to R31 and switch groups SH and SL.

The A/D converter also has a correction DAC (CDAC). The correction DAC (CDAC) has resistors R0 to R7, a switch group SCAL connected to the connection points of the resistors R0 to R7, and an output terminal VCAL. In other words, the resistors R00 to R7 in the resistor array of the resistive sub-DAC (SDAC) are used. Due to this, a capacitive element CCAL with a capacitance value 1C is disposed in the top node TOP of the main DAC, and the output terminal VCAL of the correction DAC is connected to the bottom node thereof.

The control circuit 10 has a successive approximation control unit 10-1 for controlling the switch groups of the capacitive main DAC (MDAC) and the resistive sub-DAC (SDAC), and a correction circuit L1 for controlling the switch group SCAL of the correction DAC (CDAC). Correction data Dadj, which is output by the correction logic circuit L1, controls the ON/OFF of each switch of the switch group SCAL.

In the circuit in FIG. 5, the correction DAC (CDAC) can set eight levels of output voltage VCAL with a (1/32)*VREF interval. In other words, the correction DAC has (½) LSB of resolution for 1 LSB of A/D conversion, and has a −2 LSB to +1.5 LSB correction range for 1 LSB of A/D conversion. In order to increase the resolution of correction, the resistors R0 to R7 are subdivided. In order to increase the correction range, the number of resistors is increased.

Responding to a correction control signal CAL_CNT, the correction circuit L1 of the control circuit 10 controls an internal digital input signal Din of the successive approximation control unit 10-1, measures the capacitance mismatch, and searches the correction data Dadj for correcting the capacitance mismatch.

The capacitance mismatch between the capacitive elements C3 and (C0' and C0 to C2), which are a capacitance pair to be balanced, is measured as follows. In the stage of measuring the capacitance mismatch, the switch groups SH and SL of the resistive sub-DAC (SDAC) are not operated. First the switch S1 of the comparator is turned ON, the switch SM3 is connected to the reference voltage VREF side, and the switch SM0' and SM0 to SM2 are connected to the ground GND side. The switch group SCAL of the correction DAC is set so that the voltage of the correction output VCAL becomes ½ of the output voltage range of VCAL. For example, the switch at the connection point of the resistors R4 and R3 is turned ON. Since the switch S1 is ON, the top node TOP is biased to the threshold voltage of the comparator CMP in this state.

After recharging the capacitors C0' and C0 to C3 sufficiently, the switch S1 is opened, and the switch SM3 is connected to the groun GND side and the switches SM0' and SM0 to SM2 to the VREF side. Then the comparator CMP detects the potential of the top node.

Then the potential of the top node TOP, which is the threshold of the comparator CMP, changes in accordance with the degree of capacitance mismatch between the capacitive element C3 (capacitance value 8C) and the capacitive element group C2+C1+C0+C0' (capacitance value 8C). The potential of the top node TOP decreases from the threshold if C3 >C2+C1+C0+C0', or increases if C3<C2+C1+C0+C0'.

Then the correction circuit L1 controls the correction switch group SCAL using the correction data Dadj, and performs a binary search for a value of the correction data with which potential of the top node TOP becomes closest to the threshold VREF/2 of the comparator CMP. The correction data Dadj searched by this corresponds to the capacitance error value.

In other words, the correction circuit L1 measures the degree of mismatch (capacitance error value) between the capacitive element C3 and the capacitive elements C0' and C0 to C2 as follows.
(1) S1: ON, SM0', SM0 to SM2: GND, SM3: VREF
(2) S1: OFF, SM0', SM0 to SM2: VREF, SM3: GND
(3) Search Dadj with which the potential of TOP becomes closest to VREF/2

The above measurement is performed for all the capacitance pairs to be balanced in the capacitance values. In other words, the correction data Dadj is measured for the capacitance error value between C2 and C1+C0+C0', the capacitance error value between C1 and C0+C0', and the capacitance error value between C0 and C0'.

When A/D conversion is performed, the correction amount is digitally calculated using the mismatched value Dadj measured in advance and the digital code Din which is input in the capacitive main DAC, and this correction code Dadj is input to the correction DAC. Since the output value VCAL of the correction DAC is coupled with the capacitive main DAC through a coupled capacitor CCAL, the correction amount is added to the voltage of the capacitive main DAC, and the error component is removed.

According to the present embodiment, the error value measured for each capacitance pair is output to the CPU as a measurement error MCAL. The CPU computes the correction amount DCAL corresponding to the digital code Din upon A/D conversion based on the measurement error MCAL, and stores the result in the memory 3 in FIG. 1. When A/D conversion is executed, the correction circuit L1 outputs the correction code Dadj based on this correction amount DCAL.

The relationship of the correction code DCAL and the measurement correction value MCAL will now be described.

In the circuit of the A/D converter in FIG. 5, there are four capacitance pairs to be balanced in the main DAC (MDAC). If the capacitance error values obtained as a result of measuring errors in each capacitance pair to be balanced are DM3, DM2, DM1 and DM0, then the correspondence of the error measurement result and the capacitance pair to be balanced is as follows.

DM3: C3—(C2+C1+C0+C0')

DM2: C2—(C1+C0+C0')

DM1: C1—(C0+C0')

DM0: C0—C0'  (7)

Upon A/D conversion, if each capacitive element becomes active because the internal digital signal Din becomes "1", and the reference voltage VREF is applied to the bottom switch of the capacitive element, the correction value of the corresponding capacitance is added to the main DAC by the correction DAC so as to cancel the error. Since a correction amount corresponding to each capacitive element is half of the error value of the capacitance pair, the correction amount of each capacitive element can be calculated by the following Expression (8). Details are disclosed in Japanese Patent Application Laid-Open No. 2009-232281, and all disclosure of this patent is now incorporated in the present specification by reference. For the correction amount corresponding to each capacitive element, it is assumed that the correction amount corresponding to C3 is DC3, the correction amount corresponding to C2 is DC2, the correction amount corresponding to C1 is DC1, and the correction amount corresponding to C0 is DC0.

$DC3=½*DM3$ $DC2=½*DM2-½*DC3$ $DC1=½*DM1-½*DC3-½*DC2$ $DC0=½*DM0-½*DC3-½*DC2-½*DC1$  (8)

If the above simultaneous equations are transferred, then $DC3=½*DM3$ $DC2=½*DM2-¼*DM3$ $DC1=½*DM1-⅛*DM3-¼*DM2$ $DC0=½*DM0-1/16*DM3-⅛*DM2-¼*DM1$  (9)

Therefore according to the present embodiment, the CPU determines the correction values DC3, DC2, DC1 and DC0, which are added where each capacitive element is active, from the measured capacitance error values DM3, DM2, DM1 and DM0 by computing using the above Expression (9), and stores the result in memory in advance. It is preferable that the measurement of the capacitance error values and computing processing of the correction values are performed during the calibration process before shipment from the factory or when power is turned ON.

According to the present embodiment, in the steps of measuring the capacitance error value, errors, due to the offset voltage generated when switch S1 is operated from ON to OFF, or the offset voltage which the comparator CMP originally has, are eliminated.

In other words, the switch S1 is switched from ON to OFF between the steps (1) and (2) of measuring the capacitance error value. In the case when switch S1 is a transfer MOS transistor, for example, the gate voltage is switched from H level to L level if an NMOSFET, or from L level to H level if a PMOSFET. Upon this switching, electric charges of capacitance between the gate and source or between the gate and drain flow into the top mode TOP, and are included in the measured capacitance error value, as offset voltage Vos. In the case of the comparator CMP having offset voltage as well, this offset voltage is included in the capacitance error value.

If each of the capacitance error values DM3, DM2, DM1 and DM0 between the capacitance pair is regarded as a sum of a true measured value DM', which does not include an offset error, and data Dos which corresponds to the offset voltage Vos, then $$DM3=DM3'+Dos$$
$$DM2=DM2'+Dos$$
$$DM1=DM1'+Dos$$
$$DM0=DM0'+Dos \quad (10)$$

And if Expression (10) is combined with Expression (9), then $$DC3=\tfrac{1}{2}*Dos+\tfrac{1}{2}*DM3'$$
$$DC2=\tfrac{1}{4}*Dos+\tfrac{1}{2}*DM2'-\tfrac{1}{4}*DM3'$$
$$DC1=\tfrac{1}{8}*Dos+\tfrac{1}{2}*DM1'-\tfrac{1}{8}*DM3'-\tfrac{1}{4}*DM2'$$
$$DC0=\tfrac{1}{16}*Dos+\tfrac{1}{2}*DM0'-\tfrac{1}{16}*DM3'-\tfrac{1}{8}*DM2'-\tfrac{1}{4}*DM1' \quad (11)$$

is obtained. In other words, the first term of each expression indicates the influence of the offset voltage. The influence of the offset voltage generated during the measurement of errors measurement is greater as the level of the capacitor for which the correction value is used is higher, and the relationship of the offset voltage and the capacitor is binary respectively.

The capacitance of the A/D converter has already been binary-weighted. Therefore the Expression (11) does not influence linearity. For example, if an offset is generated when an error is measured, and the influence of the offset included in DC0 is 0.1C with respect to 1C, then $$C0=1C+0.1C=1.1C$$
$$C1=2C+0.2C=2.2C$$
$$C2=4C+0.4C=4.4C$$
$$C3=8C+0.8C=8.8C \quad (12)$$

that is, the binary relationship are not lost. In other words, the linearity in the A/D conversion is not affected.

The weight of each capacitive element, however, changes, and appears as the offset of the A/D conversion characteristics. In particular, in a case of an application which requires measuring the absolute value, it is desired that the offset of the A/D conversion characteristics is as small as possible.

Therefore the successive approximation A/D converter of the present embodiment determines an offset in the above mentioned step of measuring the capacitance, and removes the term of the offset value Dos from the above mentioned Expression (10) or (11).

FIG. 6 illustrates a procedure of measuring a capacitance error value of the successive approximation A/D converter according to the first embodiment. In FIG. 6, "0" is a state where each switch SM is connected to the ground GND side, and "1" is a state where each switch SM is connected to the reference voltage VREF side. In other words, if the digital input Din generated by the control circuit 10 is "0", the switch SM is connected to the GND side, and if "1", the switch SM is connected to the VREF side.

Figures 6A, 6B:
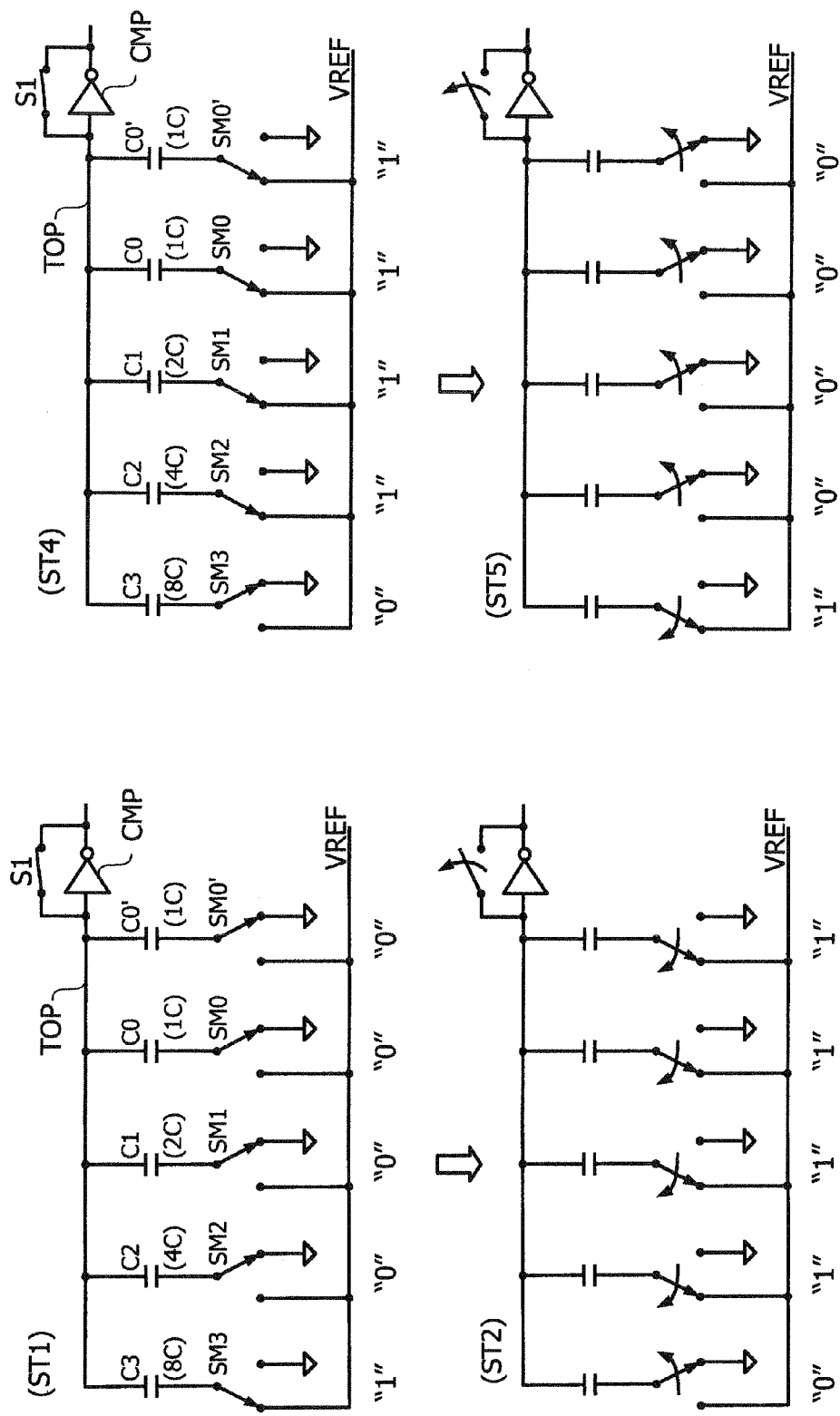
FIG. 6 illustrates a procedure of measuring a capacitance error value of the successive approximation A/D converter according to the first embodiment.

FIG. 6 also depicts a procedure for the control circuit 10 to measure the capacitance error values of the capacitance pair C3 and C2+C1+C0+C0'. In other words, the control circuit 10 first controls the switches as depicted in FIG. 6A, and measures the error, then controls the switches as depicted in FIG. 6B, and measures the error. In the measurement steps, electric charges are injected into the top node TOP when the switch S1 is switched from ON to OFF, and therefore the offset component is included in the error measurement result. Hence an error value after the offset is removed can be determined using the obtained two error values, Ea and Eb.

The steps of measuring the capacitance error value are as follows. In FIG. 6A, (ST1) S1: ON, SM0', SM0 to SM2: "0"=GND, SM3: "1"=VREF (ST2) S1: OFF, SM0', SM0 to SM2: "1"=VREF, SM3: "0"=GND (ST3) Search Dadj (Ea) with which potential of TOP becomes closest to VREF/2.

In FIG. 6B (ST4) S1: ON, SM0', SM0 to SM2: "1"=VREF, SM3: "0"=GND (ST5) S1: OFF, SM0', SM0 to SM2: "0"=GND, SM3: "1"=VREF (ST6) Search Dadj (Eb) with which potential of TOP becomes closest to VREF/2

(ST7) Compute (Ea-Eb)/2, (Ea-Eb)/2 becomes a true capacitance error value after offset Vos is removed.

The measuring steps will now be described with reference to FIG. 6. In FIG. 6A, the digital input Din to the capacitance DAC is set to 10000 first, and each switch SM is connected as illustrated according to the above mentioned procedure (ST1). The switch S1 is turned ON. Then the potential of the top node TOP becomes the threshold voltage (Vt) of the comparator CMP. The electric charges stored in the capacitors at this time are the same as Expression 1).

$$(Vt-VREF)*C3+Vt*(C2+C1+C0+C0') \quad (1)$$

Then the switch S1 is turned OFF, and the digital input Din to the capacitive DAC is set to 01111, and each switch SM is connected as illustrated, according to the above mentioned procedure (ST2). As a result, the potential voltage of the top node TOP changes according to the difference of the capacitance pair. If the voltage after the change is Vo, the following Expression (2), having the Expression (1) on the left hand side, is established.

$$(Vt-VREF)*C3+Vt*(C2+C1+C0+C0')=Vo*C3+(Vo-VREF)*(C2+C1+C0+C0') \quad (2)$$

If the voltage change component (Vt-Vo) of TOP in Expression (2) is solved, the solution is given by the following Expression (3).

$$Vt-Vo=(C3-(C2+C1+C0+C0'))/(C3+C2+C1+C0+C0')*VREF \quad (3)$$

Since the potential change is generated in TOP in accordance with the capacitance error of the measurement target capacitance pair, the correction circuit L1 in the control circuit 10 controls the switch of the correction DAC (CDAC) based on the correction data Dadj according to the procedure (ST3), so as to measure the value of Vt-Vo.

Actually, however, when the switch S1 is switched to OFF (open), electric charges are injected from the parasitic capacitance of the switch to TOP, and therefore the comparison threshold of the comparator CMP has offset. Also in the case of the comparator CMP constituted by a differential circuit, the comparator has offset. Hence in the result measured using the comparator, offset voltage Vos is generated. Considering these effects, Expression (3) is corrected, then the error measurement result Ea in the case of FIG. 6A is given by the following Expression (4).

$$Ea=(C3-(C2+C1+C0+C0'))/(C3+C2+C1+C0+C0')*VREF+Vos \quad (4)$$

Then, according to the procedure in FIG. 6B, the control circuit 10 executes the switch operation in FIG. 6A in reverse. In other words, while the operation 10000→00001 was performed in FIG. 6A, the complementary operation 01111→10000 is performed in FIG. 6B. This means that the above mentioned procedures (ST4) and (ST5) are performed.

If the error is measured in this way, the error measurement result Eb according to FIG. 6B is given by Expression (5). The calculation procedure is the same as the case of FIG. 6A.

$$Eb = -(C3-(C2+C1+C0+C0'))/(C3+C2+C1+C0+C0') *VREF + Vos \quad (5)$$

This error measurement result Eb is detected as the correction data Dadj by the above mentioned procedure (ST6).

By performing the two types of measurements in FIG. 6A and FIG. 6B for the capacitance pair C3 and C2+C1+C0+C0' like this, the measurement results by Expression (4) and Expression (5) are obtained. Since the absolute values of the first terms of these expressions are the same, and the signs (negative/positive) thereof are different, the following expression is obtained.

$$(Ea-Eb)/2 = (C3-(C2+C1+C0+C0'))/(C3+C2+C1+C0+C0')*VREF \quad (6)$$

In other words, (Ea-Eb)/2 of Expression (6) is a capacitance error value between the capacitance pair after the offset (Vos) is removed.

The procedure to measure the difference of the highest capacitance C3 and the capacitance (C2+C1+C0+C0') to be balanced with C3 was depicted above. Hereafter an error is sequentially measured for the rest of the capacitance pairs to be balanced according to the same procedure. Using the obtained capacitance error values after the influence of offset is removed, the CPU determines the error correction values DC3, DC2, DC1 and DC0 based on the above mentioned Expression (6), and stores the result in the memory.

When A/D conversion is performed, the correction circuit L1 in the control circuit 10 outputs the correction data Dadj corresponding to the correction values DC3, DC2, DC1 and DC0 to the correction DAC, responding to that the switch CM is connected to the reference voltage VREF by the internal digital input Din. Thereby the error of the capacitance pair is solved, and the linearity of the A/D conversion characteristic is improved, and as a result, the A/D conversion can be performed at higher accuracy.

According to the procedure for measuring the capacitance error value, this sequence of the procedures ST1 to ST3 and ST4 to ST6 may be reversed. In the same manner, the sequence of the procedures ST1 and ST2 may be reversed, and the sequence of the procedures ST4 and ST5 may be reversed.

Figure 7:
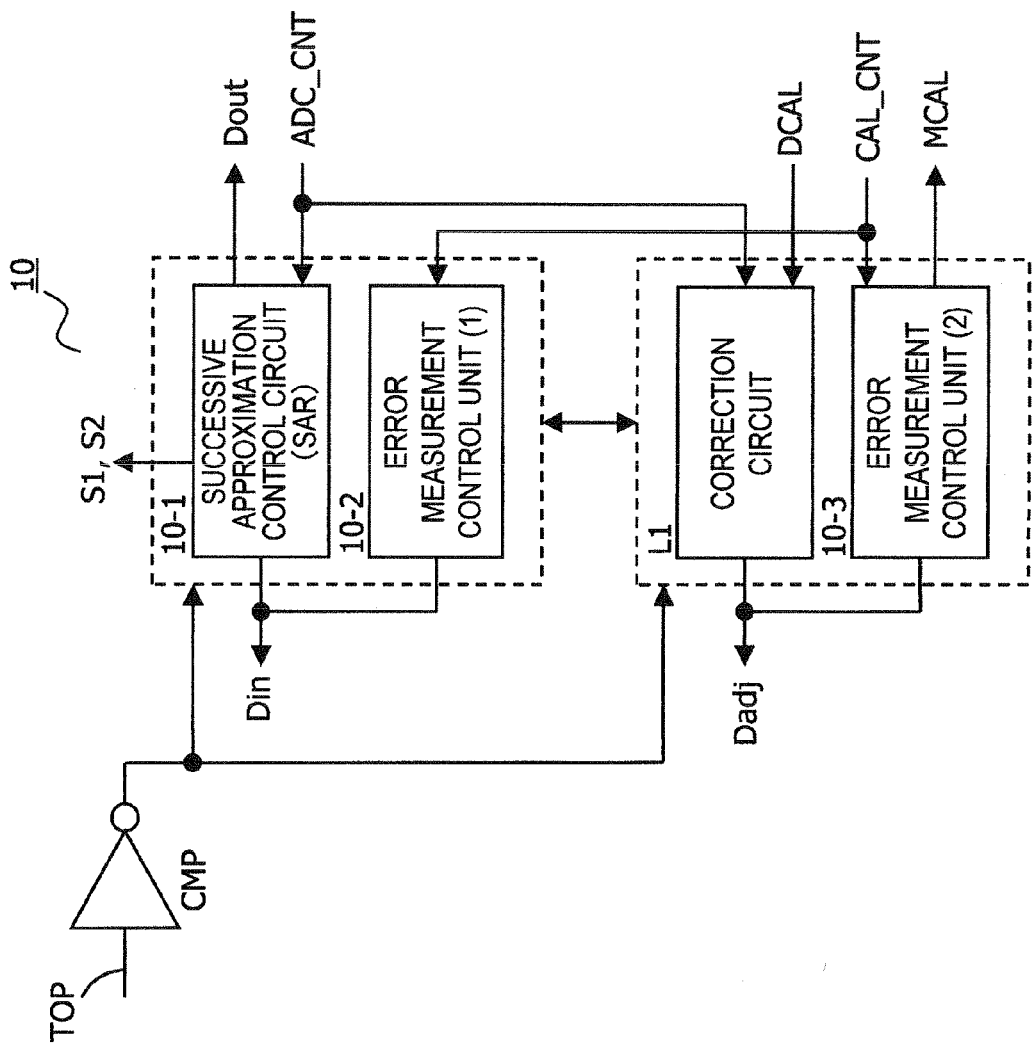
FIG. 7 is a block diagram of the control circuit 10 according to the first embodiment.

FIG. 7 is a block diagram of the control circuit 10 according to the first embodiment. The control circuit 10 is comprised of a circuit for generating the internal digital input Din and a circuit for generating the correction data Dadj. The former has a successive approximation control circuit 10-1, which generates internal digital input Din for successive approximation upon A/D conversion, and an error measurement control circuit (1) 10-2, which generates internal digital input Din for measuring a capacitance error value between a capacitance pair upon calibration. The latter has a correction unit L1 which generates correction data Dadj for successive approximation upon A/D conversion, and an error measurement control circuit (2) 10-3 which generates correction data Dadj for measuring a capacitance error value between a capacitance pair upon calibration.

Responding to a calibration control signal CAL_CNT from the CPU, the error measurement control units 10-2 and 10-3 generate the internal digital input Din, correction data Dadj, and a control signal to the switch S1, so as to perform the above mentioned procedure ST1 to ST6. For example, the error measurement control units 10-2 and 10-3 generate Din=10000→00001 in the procedures ST1 and ST2, and generate Dadj (Ea) based on the binary search in the procedure ST3. The error measurement control units 10-2 and 10-3 also generate Din=01111→10000 in the procedures ST4 and ST5, and generate Dadj (Eb) based on the binary search in the procedure ST6. Then Ea-Eb is output to the CPU as the measured value MCAL.

On the other hand, responding to the A/D conversion control signal ADC_CNT from the CPU, the successive approximation control circuit 10-1 and the error circuit L1 generate internal digital input Din, corrective data Dadj and a control signal to the switch S1, which is not illustrated. The correction data Dadj is determined by the correction value DCAL (DM) computed by the CPU based on the above mentioned Expression (9), and the internal digital input Din.

FIG. 8 illustrates a procedure of measuring the second capacitance error value of the successive approximation A/D converter according to the first embodiment. FIG. 8 also depicts a procedure of measuring the capacitance values of the capacitance pair C3 and C2+C1+C0+C0'. The procedure of measuring the second capacitance error value is as follows.

Figure 8B:
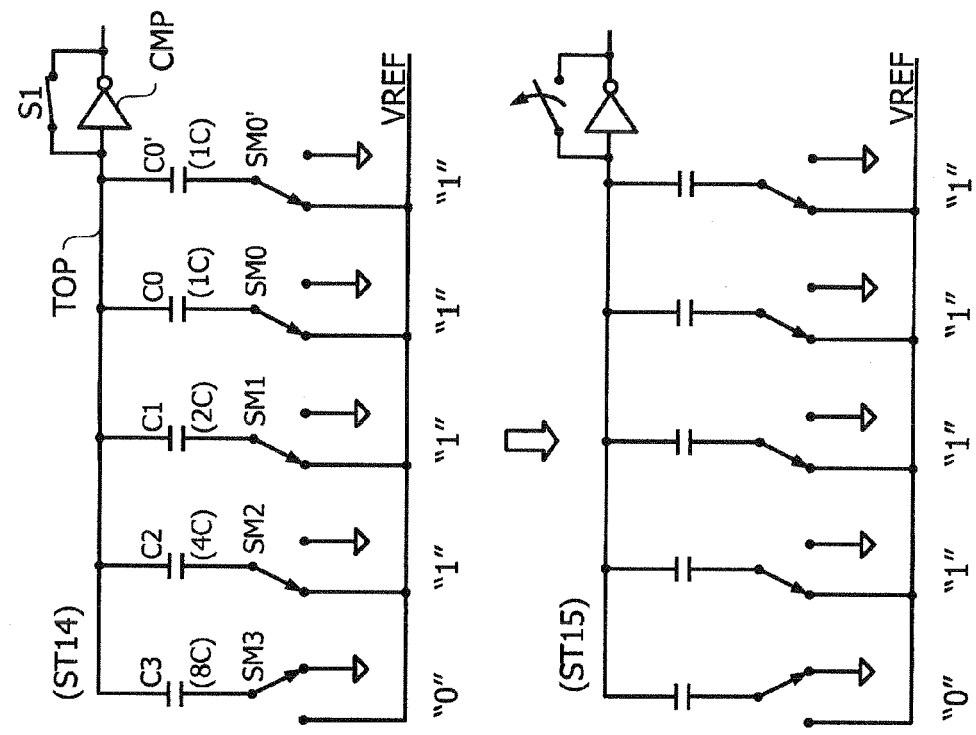
FIG. 8 illustrates a procedure of measuring the second capacitance error value of the successive approximation A/D converter according to the first embodiment.
Figure 8A:
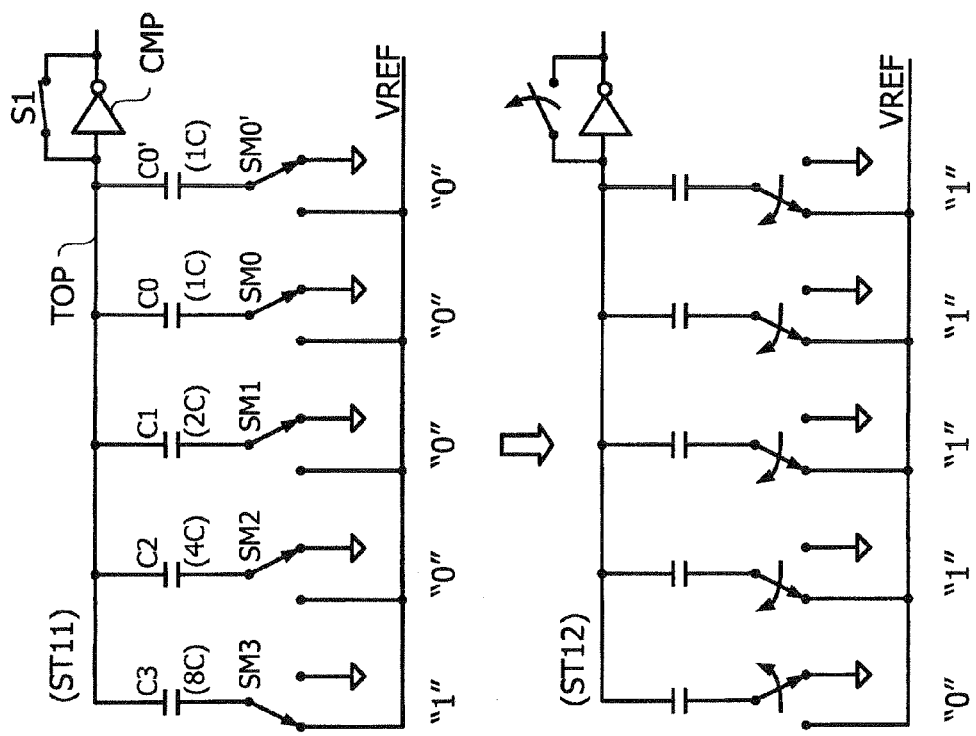

In FIG. 8A (ST11) S1: ON, SM0', SM0 to SM2: "0"=GND, SM3: "1"=VREF (ST12) S1: OFF, SM0', SM0 to SM2: "1"=VREF, SM3: "0"=GND (ST13) Search Dadj (Ea) with which potential of TOP becomes closest to VREF/2.

In FIG. 8B, without changing the state of the switches of the main DAC in (ST13), (ST14) S1: ON, SM0', SM0 to SM2: "1"=VREF, SM3: "0"=GND (ST15) S1: OFF, SM0', SM0 to SM2: "1"=VREF, SM3: "0"=GND (ST16) Search Dadj (Eb) with which potential of TOP becomes closest to VREF/2

(ST17) Compute Ea-Eb, Ea-Eb becomes a true capacitance error value after the offset is removed.

In other words, an error Ea including offset is measured in the first measurement (FIG. 8A), and only offset Eb is measured in the second measurement (FIG. 8B).

This will be measured according to FIG. 8. In the first measurement in FIG. 8A, the switch S1 is ON, and the internal digital input Din is controlled as follows, to perform procedures ST11 and ST12.

Din=10000→01111

Then in procedure ST13, a correction code Dadj, with which an error value appeared in the top node TOP becomes the threshold of the comparator, is searched by the binary search method.

The error measurement result Ea measured by the procedure depicted in FIG. 8A includes the influence of the offset voltage Vos, as depicted in Expression (16).

$$Ea = (C3-(C2+C1+C0+C0'))/(C3+C2+C1+C0+C0') *VREF + Vos \quad (16)$$

Then in the second measurement in FIG. 8B, the switch S1 is turned ON while keeping the internal digital input Din at 01111, so as to bias the top node TOP to the threshold Vt, and the switch S1 is turned OFF thereafter. Due to this, the potential change caused by injecting electric charges, when the switch S1 is switched from ON to OFF, is generated in the top node TOP. Then in the procedure ST16, the correction code Dadj with which the potential change which appears in the top node TOP disappears, in other words, the correction code Dadj with which the TOP becomes the threshold Vt of the comparator, is searched by the binary search method. The value Eb obtained here corresponds to the offset voltage, as depicted in Expression (17).

$$Eb=Vos \quad (17)$$

Then in the procedure ST17, the offset Eb obtained in the second measurement is subtracted from the measurement value Ea obtained in the first measurement. Thereby the error value Ea-Eb, which does not include offset, is obtained.

$$Ea\text{-}Eb=(C3-(C2+C1+C0+C0'))/(C3+C2+C1+C0+C0') \\ *VREF \quad (18)$$

In the second procedure of measuring the capacitance error value, the internal digital input Din may be changed in reverse in the procedures ST11 and ST12. Din=01111→10000 In this case, Din=10000 is maintained in the subsequent procedures ST13 to ST16.

In the second procedure of measuring the second capacitance error value, the sequence of the procedure ST11 to ST13 and ST14 to ST16 may be reversed. In other words, the offset Vos is determined first, then the capacitance error value with offset is determined, and the offset Vos is subtracted from the capacitance error value.

The second procedure of measuring the second capacitance error value is performed by the error measurement control units 10-2 and 10-3 in the control circuit 10 in FIG. 7.

In the first embodiment, the correction DAC (CDAC) is constituted by the resistive correction DAC, which generates the correction voltage VCAL using the resistor array and the switch group. However, the correction DAC can also be constituted by a capacitive DAC which is comprised of the later mentioned capacitive element group and the switch group. In this case, the switch group of the capacitive DAC for corrections is connected to the ground or the VREF by a correction code Dadj, and the correction voltage VCAL is generated in the top node. In the procedure of detecting the correction code of the capacitive DAC for correction, the above mentioned offset component is detected and cancelled.

[Second Embodiment]

In the first embodiment, the successive approximation A/D converter having the capacitive main DAC and the resistive sub-DAC was described. In the second embodiment, a successive approximation A/D converter having a capacitive main DAC and a capacitive sub-DAC will be described.

Figure 9:
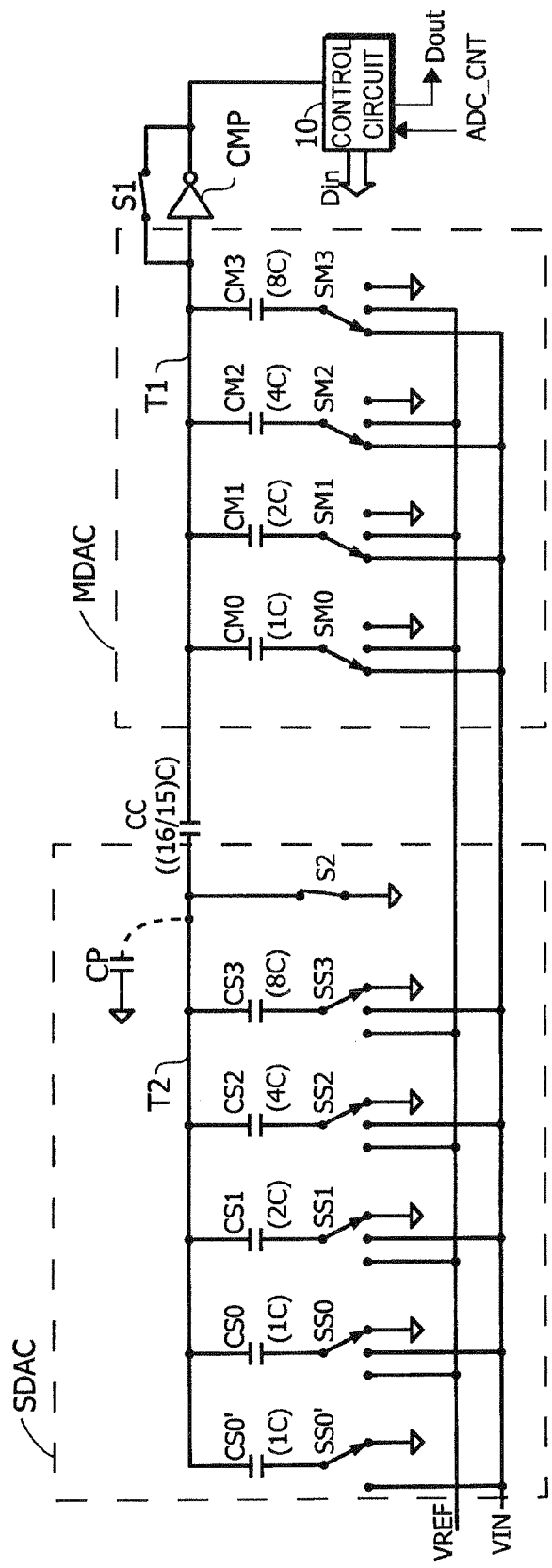
FIG. 9 illustrates a successive approximation A/D converter having a capacitive main DAC and a capacitive sub-DAC.

FIG. 9 illustrates a successive approximation A/D converter having a capacitive main DAC and a capacitive sub-DAC. The capacitive main DAC (MDAC) is the same as the first embodiment. In other words, the capacitive main DAC (MDAC) has capacitive elements CM0, CM1, CM2 and CM3 of which respective capacitance values have a relationship of 1C, 2C, 4C and 8C (weighting with a ratio which is a power of 2), and a group of switches SM0 to SM3 disposed in the bottom nodes of the capacitive elements, and the top nodes of the capacitive elements are connected to a top node T1. The top node T1 is connected to the input of the comparator CMP. The capacitive main DAC (MDAC) performs conversion for the significant 4 bits.

The capacitive sub-DAC (SDAC), on the other hand, has capacitive elements CS0', CS0, CS1, CS2 and CS3 of which respective capacitance values have a relationship of 1C, 1C, 2C 4C and 8C, and a group of switches SS0' and SS0 to SS3 disposed in the bottom nodes of the capacitive elements, and the top nodes of the capacitive elements are connected to the top node T2. The top node T2 is connected to the top node T1 of the capacitive main DAC (MDAC) via a coupling capacitive element CC. The capacitive sub-DAC (SDAC) performs conversion for the insignificant 4 bits.

The coupling capacitor CC couples the main DAC and the sub-DAC. An earth capacitance when viewing the top node T2 of the sub-DAC from the top node T1 of the main DAC is 1C. In other words, in order for the 4-bit main DAC and the 4-bit sub-DAC to continuously operate as an 8-bit DAC, the total capacitance 16C of the capacitive elements CS0' and CS0 to CS3 and the coupling capacitance CC is 1C when viewed from the top node T1. Therefore (16C*CC)/(16C+CC)=1C. If this expression is solved to determine CC, CC=(16/15)C is obtained.

Generally for semiconductor integrated circuits, a higher accuracy can be obtained for a capacitive DAC compared with a resistive DAC. Because of the case of a polysilicon resistor, ion implantation for adding impurities is required after depositing polysilicon, in order to adjust the resisitivity to a desired value. Therefore in terms of a specific accuracy of a polysilicon resistor, the ununiformity of the added impurities, in addition to the roughness and the ununiformity of the form, influences the matching of the elements. In the case of a capacitive element, such as a polysilicon-polysilicon capacitor, in terms of a specific accuracy of the capacitance value, roughness and ununiformity of inter-electrode insulating film influences the element matching, but there is no negative influence of ununiformity of the added impurities as in the case of a resistor. Thus in the case of a resistive element, there are more steps which directly influence the resistance value compared with a capacitive element, and as a result, a specific accuracy of the resistive element is not as good as the capacitive element.

Hence compared with the configuration of the capacitive main DAC and the resistive sub-DAC in the first embodiment, the conversion accuracy is higher in the configuration of the capacitive main DAC and the capacitive sub-DAC in the second embodiment.

Furthermore while electric current always flows through the resistive element circuit in the case of the resistive sub-DAC, the steady current does not flow in the case of the capacitive sub-DAC, hence power consumption can be decreased. Also in the case of the resistive sub-DAC, response speed after switching is slow because of the time constant generated by a resistive element and the coupling capacitor, but in the case of the capacitive DAC, which has no resistive element, the time constant decreases and response speed becomes faster.

The A/D conversion operation of the successive approximation A/D converter having the capacitive main DAC and the capacitive sub-DAC is as follows. First upon sampling, the switches S1 and S2 are turned ON, and all the switches SM0 to SM3, SS0' and SS0 to SS3 are connected to the input terminal VIN. Thereby electric charges are charged into all the capacitive elements according to the input voltage VIN. At this time, the top node T1 becomes a threshold Vt of the comparator CMP, that is VREF/2, for example.

Then in the successive approximation, conversion is performed in the capacitive main DAC (MDAC) as mentioned above, sequentially from the most significant bit. The switches S1 and S2 are turned OFF, the switch SM3 is connected to the reference voltage VREF, and the rest of the switches SM0 to SM2 are connected to the ground GND. Here the most significant bit becomes 0 or 1, depending on the top node T1 rising or falling from the threshold Vt.

Then according to the determination result, the switch SM3 is maintained at ground GND if the most significant bit is 0, or at the reference voltage VREF if the most significant bit is 1, the switch SM2 is connected to VREF and SM0 to SM1 are connected to GND. Here the next bit is determined, as mentioned above, depending on whether the top node is higher or lower than the threshold Vt. In the same manner, all the significant bits are detected.

Conversion of the insignificant bits is performed by the capacitive sub-DAC (SDAC) in the same manner as the capacitive main DAC.

In the A/D converter in FIG. 9 having a configuration of the capacitive sub-DAC connected to the capacitive main DAC via the coupling capacitor CC, if parasitic capacitance CP exists in the node T2, the output voltage of the node T2 of the sub-DAC is attenuated, and continuity of the main DAC and the sub-DAC is lost. In other words, in the sub-DAC, the potential of the node T2 is changed while connecting the switches SS0' and SS0 to SS3 to either GND or VREF, and this potential change is transferred to the top node T1 via the coupling capacitor CC. However if a parasitic capacitance CP exists in the node T2, influence of the potential change of the node T2, depending on the connection states of the switches SS0 and SS0 to SS3, on the node T1 is weakened even more, as the capacitance value of CP is larger.

However, the capacitance value of the parasitic capacitance CP is difficult to predict, and becomes one uncertain element in designing. Due to the parasitic capacitance CP, inclination of the conversion characteristics, which is a potential of the top node T1 with respect to the internal digital input Din on the insignificant bit side, decreases, and does not match with the inclination of the conversion characteristic of the significant bits. As a result, continuity of the insignificant bits and the significant bits is lost in the conversion characteristics. In other words, the degree of coupling of the sub-DAC (SDAC) and the main DAC (MDAC) is shifted from an ideal degree.

Another shortcoming is that it is difficult to manufacture the coupling capacitor CC to have the capacitance value (16/15)C. If the capacitance value of the capacitive element maintains an integer ratio, accurate matching can be implemented by disposing single capacitive elements having a same form side by side. However the capacitance (16/15)C cannot be implemented by a combination of single capacitive elements.

Figure 10:
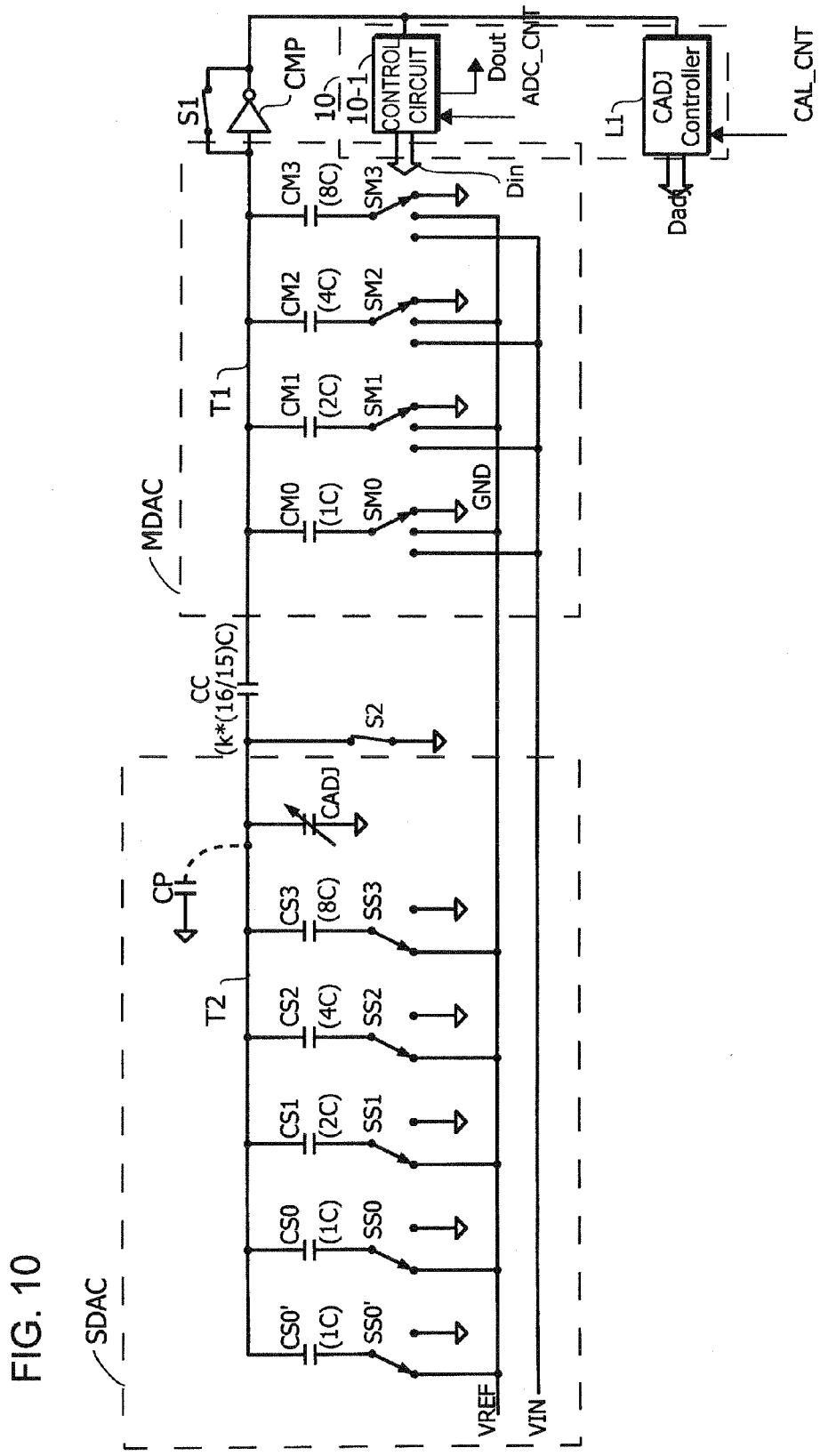
FIG. 10 illustrates a successive approximation A/D converter according to the second embodiment.

FIG. 10 illustrates a successive approximation A/D converter according to the second embodiment. Just like FIG. 9, this A/D converter has a comparator CMP, switches S1 and S2, a capacitive main DAC (MDAC), a capacitive sub-DAC (SDAC), coupling capacitor CC and a control unit 10.

However unlike FIG. 9, this A/D converter further has a variable capacitor for adjustment CADJ in the common node T2 of the capacitive sub-DAC (SDAC) in order to suppress influence by the parasitic capacitance CP. The capacitance value of this adjustable capacitor CADJ can be variably set by adjustment data Dadj generated by an adjustment circuit L1 of the control circuit 10. The coupling capacitor CC has a capacitance value which is k(k>1) times of (16/15)C.

Unlike FIG. 9, the input terminal VIN of the A/D converter in FIG. 10 can be connected only to the main DAC side. Therefore the switches of the sub-DAC are connected to the GND side upon the sampling operation during A/D conversion.

However it may be designed, just like FIG. 9, that the input terminal VIN can also be connected to the sub-DAC side. As the capacitance value of the capacitive element to which the input terminal VIN is connected is greater, the conversion accuracy increases, but the input terminal VIN side is demanded to have high drive capability.

The control circuit 10 in FIG. 10 has a similar configuration to the control circuit depicted in FIG. 7, just like the first embodiment. However the correction circuit L1 is an adjustment circuit, and the error measurement control units 10-2 and 10-3 are coupling degree measurement control units. The measured adjustment code Dadj is directly used as an adjustment code during A/D conversion.

As mentioned above, in an ideal state where the parasitic capacitance CP of the node T2 of the capacitive sub-DAC (SDAC) is zero, the capacitance value of the coupling capacitor CC is set to (16/15)C, whereby the 4-bit main DAC and the 4-bit sub-DAC are combined, and a total 8-bit DAC is implemented. In other words, ideally the potential of the top node T1 is the same in both a first state where the switches SS0' and SS0 to SS3 of the sub-DAC (SDAC) are all VREF and the switch SM0 in the least significant bit of the main DAC (MDAC) is GND, and a second state where the switches SS0' and SS0 to SS3 of the sub-DAC (SDAC) are all GND and the switch SM0 in the least significant bit of the main DAC (MDAC) is VREF. In this ideal state, the degree of capacitance coupling of the sub-DAC and the main DAC is ideal, and the linearity of the conversion characteristics of the significant bits and insignificant bits is maintained.

In reality however, earth parasitic capacitance CP exists in the node T2, and the amplitude in the node T2 of the sub-DAC is attenuated by the CP, hence the degree of the capacitance coupling between the sub-DAC and the main DAC deviates from the ideal state, which makes it difficult to maintain continuity of the main DAC and the sub-DAC.

Therefore in the A/D converter in FIG. 10, an adjustable capacitor CADJ is additionally disposed, and the value of the coupling capacitor CC is set to k(k>1) times of (16/15)C in advance (CC=k*(16/15)C). By multiplying the value CC by k, the degree of contribution of the sub-DAC to the main DAC increases k times. Then the capacitance value of the adjustable capacitor CADJ is adjusted so that the continuity of the main DAC and the sub-DAC is maintained, in other words, so that the potential of the top node T1 is the same between the above mentioned first state and the second state. This means that the degree of contribution of the sub-DAC, which increased to k times by CC=k*(16/15)C, is weakened appropriately by the adjustable capacitor CADJ, so as to adjust the degree of contribution to that in the ideal state. For this, the capacitance value of the coupling capacitor CC is set to a capacitance value with which the attenuated portion of the sub-DAC due to the combined capacitance of the minimum value of the adjustable capacitor CADJ and the parasitic capacitance CP can be compensated. It is possible that the adjustable capacitor CADJ is set with an interval sufficiently smaller than one LSB of the A/D conversion.

In the above mentioned successive approximation A/D converter having the capacitive main DAC and the capacitive sub-DAC, disposing the adjustable capacitor CADJ is disclosed in, for example, Japanese Patent Application Laid-Open No. 2010-45723, and the content of the disclosure is incorporated in the present description by the reference.

A procedure to adjust the adjustable capacitor CADJ in the A/D converter in FIG. 10 will be described. This adjustment procedure is performed by the comparison control circuit 10-1 which generates internal digital input Din in the control circuit 10 and the adjustment circuit L1 which generates the adjustment code Dadj.

The sub-DAC (SDAC) is a DAC which can be set to 0/16, 1/16, 2/16 to 16/16 with respect to full scale. Ideally one LSB of the 4-bit main DAC matches the value corresponding to 16/16 of the 4-bit sub-DAC.

First the control circuit 10 connects the switches S1 and S2, connects the switches SM0 to SM3 to the ground GND side, and connects the switches SS0' and SS0 to SS3 to the VREF side. Thereby the top node T1 is biased to the threshold Vt of the comparator CMP, and the node T2 is biased to 0 V.

The control circuit 10 opens the switches S2 and S1, and then connects the switch SM0 to the VREF side and the switches SS0' and SS0 to SS3 to the ground GND side. In other words, the control circuit 10 drops the bottom node of the capacitive element array on the sub-DAC side from VREF to GND. Then the potential of the node T1 decreases if the contribution of the sub-DAC is too much, or increases if too little. The comparator CMP determines whether the potential of the node T1 increased or decreased, and the control circuit 10 decreases the contribution by increasing CADJ if the potential of the node T1 decreased, or increases the contribution by decreasing CADJ if the potential of the node T1 increased. In this case, it is more efficient if the optimum adjustment data Dadj is detected using a binary search, for example. Finally the adjustment ends when adjustment is performed until the minimum unit with which the adjustable capacitor CADJ can be adjusted.

In other words, the capacitive element CM0 (1C) of the significant bit and all the capacitive elements CS0' and CS0 to CS3 (16C) of the insignificant bits have a same capacitance value 1C when viewed from the plate node T1. Therefore a capacitance value of the adjustable capacitor CADJ is set so that the potential of the plate node T1, when this capacity pair is controlled with a reversed phase, does not change from the threshold Vt.

This means that the connections of VREF and GND in the above mentioned adjustment procedure may be reversed. In other words, the control circuit 10 connects the switches S1 and S2, connects the switch SM0 to the VREF side, connects the switches SS0' and SS0 to SS3 to the GND side, then opens the switches S2 and S1, connects the switch SM0 to the GND side, and the switches SS0' and SS0 to SS3 to the VREF side. In either case of the procedures, the switches SM1 to SM3 may be maintained to the GND side or the VREF side.

By adjusting the capacitance value of the adjustable capacitor CADJ like this, and executing A/D conversion using the adjustment value Dadj finally obtained, one LSB of the main DAC and full scale of the sub-DAC can be matched, hence continuity of the main DAC and the sub-DAC can be implemented. As a result, the problem that remains in FIG. 5 can be solved, and a high precision A/D converter can be implemented.

In the above adjustment procedure, the capacitor CM0 in the least significant bit of the main DAC and the full scale (capacitors CS0' and CS0 to CS3) of the sub-DAC are compared. In other words, the switches S1 and S2 are turned ON first to charge the capacitive elements, then the switches S1 and S2 are opened (turned OFF), and the capacitive element CM0 in the least significant bit of the main DAC and the bottom switches of all the capacitive elements of the sub-DAC are reversed. Then the capacitance value of the adjustable capacitor CADJ is adjusted by the adjustment code Dadj, so that the voltage change generated in the node T1 is minimized.

However in this step, offset is generated in the error measurement result by injecting electric charges to the nodes T1 and T2 generated upon opening (turning OFF) the switches S1 and S2. Therefore this offset component is not adjusted by the adjustable capacitor CADJ, and this affects the continuity of the main DAC and the sub-DAC. Since the capacitance value of the adjustable capacitor CADJ, including the offset component, is adjusted, discontinuity due to the offset is generated in a portion where the least significant bit of the significant bits on the main DAC side is switched upon A/D conversion, and A/D conversion characteristics deteriorate.

The comparator CMP in FIG. 10 is constituted by the inverter and the switch S1 to simplify explanation, but a differential circuit, for example, can be used. However the offset voltage of a differential circuit also generates an error in the adjustment value of the adjustable capacitor CADJ in the same manner as mentioned above.

Therefore in the successive approximation A/D converter according to the second embodiment, the control circuit 10 detects the above mentioned offset component and removes the offset component from the adjustment value of the adjustable capacitor CADJ in the procedure of adjusting the adjustable capacitor CADJ.

Figure 11:
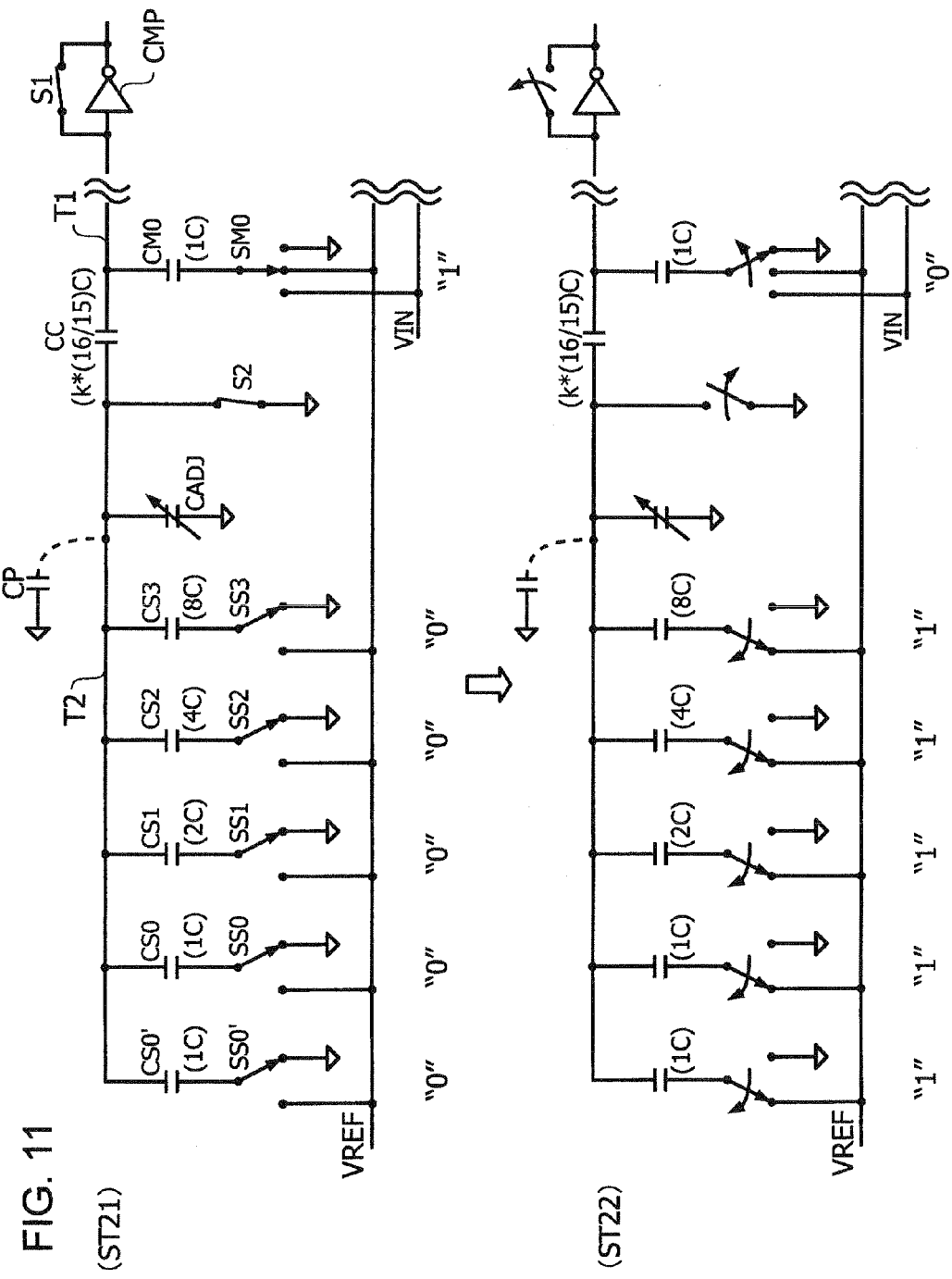
FIG. 11 and FIG. 12 illustrate a procedure for adjusting the adjustable capacitor CADJ in the A/D converter having the capacitive main DAC and the capacitive sub-DAC.
Figure 12:
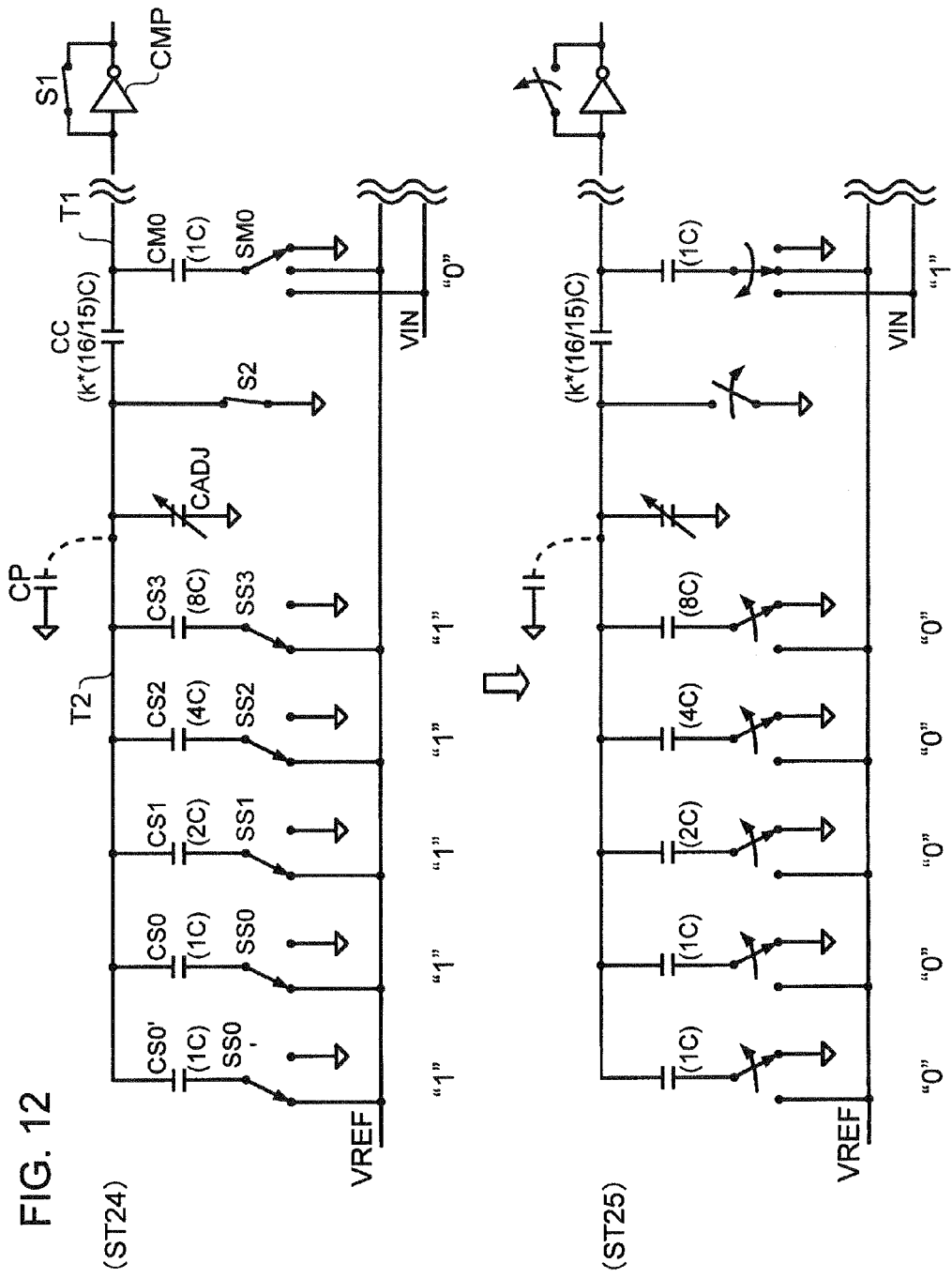

FIG. 11 and FIG. 12 illustrate a procedure for adjusting the adjustable capacitor CADJ in the A/D converter having the capacitive main DAC and the capacitive sub-DAC.

Steps for measuring the adjustment value of the adjustable capacitor CADJ by comparing the capacitor CM0 and the capacitors CS0' and CS0 to CS3 are as follows.

In FIG. 11,
(ST21) S1,S2: ON, SM0: "1"=VREF, SS0', SS0 to SS3: "0"=GND
(ST22) S1,S2: OFF, SM0: "0"=GND, SS0', SS0'to SS3: "1"=VREF
(ST23) Search Dadj_a with which the potential of T1 becomes closest to VREF/2 (=Vt).
In FIG. 12,
(ST24) S1,S2: ON, SM0: "0"=GND, SS0', SS0'to SS3: "1"=VREF
(ST25) S1,S2: OFF, SM0: "1"=VREF, SS0', SS0'to SS3: "0"=GND
(S26) Search Dadj_b with which the potential of T1 becomes closest to VREF/2 (=Vt)
(ST27) Compute (Dadj_a-Dadj_b)/2, (Dadj_a-Dadj_b)/2 becomes a true adjustment value after the offset is removed.

In the above steps, the switches SM1 to SM3 of the main DAC are held in either VREF or GND.

These measurement steps will be described with reference to FIG. 11 and FIG. 12. First as the procedure ST21 in FIG. 11 depicts, the control circuit 10 connects (turns ON) the switches S1 and S2, and sets the digital input Din such that the least significant bit of the main DAC is 1, and the sub-DAC is 00000. Then the potential of the node T1 is biased to the threshold voltage (Vt=VREF/2) of the comparator CMP, and the potential of the node T2 is biased to 0 V.

Then as the procedure ST22 depicts, the control circuit 10 opens (turns OFF) the switches S1 and S2 and sets the least significant bit of the main DAC to 0, and the sub-DAC to 11111. Then a potential difference is generated in the node T1 according to the difference of the weight of the capacitor CM0 of the least significant bit of the main DAC and the heaviest weight of the sub-DAC. This potential difference is detected by the comparator CMP, as the procedure ST23 depicts, and a capacitance value (Dadj_a) of the adjustable capacitor CADJ with which the potential difference approximates to zero is searched.

In the nodes T1 and T2, however, electric charges are injected when the switches S1 and S2 are opened, and a comparator offset is included, and the adjustment value Dadj of the adjustable capacitor CADJ includes the influence of the offset. Here if Dadj_a is an obtained adjustment value including the influence of the offset, Dadj' is a true adjustment value, and Dos is an influencing component of the offset included in the obtained adjustment value, then the relationship becomes as depicted in Expression (13).

$$Dadj\_a = Dadj' + Dos \qquad (13)$$

Since this adjustment value Dadj_a includes an influence of offset, discontinuity is generated in the switching codes of the sub-DAC and the main DAC. Hence the control circuit 10 performs measurement in FIG. 12, in addition to the measuring in FIG. 11. FIG. 12 is a reversal of the switch control in FIG. 11.

As the procedure ST24 in FIG. 12 depicts, the control circuit 10 connects (turns ON) the switches S1 and S2, and sets the digital input Din such that the least significant bit of the main DAC is 0, and the sub-DAC is 11111. Then as the procedure ST25 depicts, the control circuit 10 opens (turns OFF) the switches S1 and S2, and sets the digital input Din such that the least significant bit of the main DAC is 1, and the sub-DAC is 00000, which is the reverse of the procedure ST24. Then as procedure ST26 depicts, the potential difference generated in the node T1 is detected by the comparator CMP, and a capacitance value (Dadj_b) of the adjustable capacitor CADJ with which this potential difference approximates to zero is searched.

The adjustment value Dadj_b is given by Expression (14).

$$Dadj\_b = Dadj' + Dos \tag{14}$$

The control circuit 20 calculates two types of adjustment values as follows according to the procedure ST27, then the true adjustment value Dadj', not including the offset, is obtained.

$$(Dadj\_a - Dadj\_b)/2 = Dadj' \tag{15}$$

By using the adjustment value Dadj' determined according to Expression (15), the influence of the comparator offset upon adjusting the adjustable capacitor CADJ can be removed. As a result, discontinuity of switching portions of the main DAC and the sub-DAC can be suppressed. As a result, an A/D converter having high accuracy can be implemented.

Figure 13:
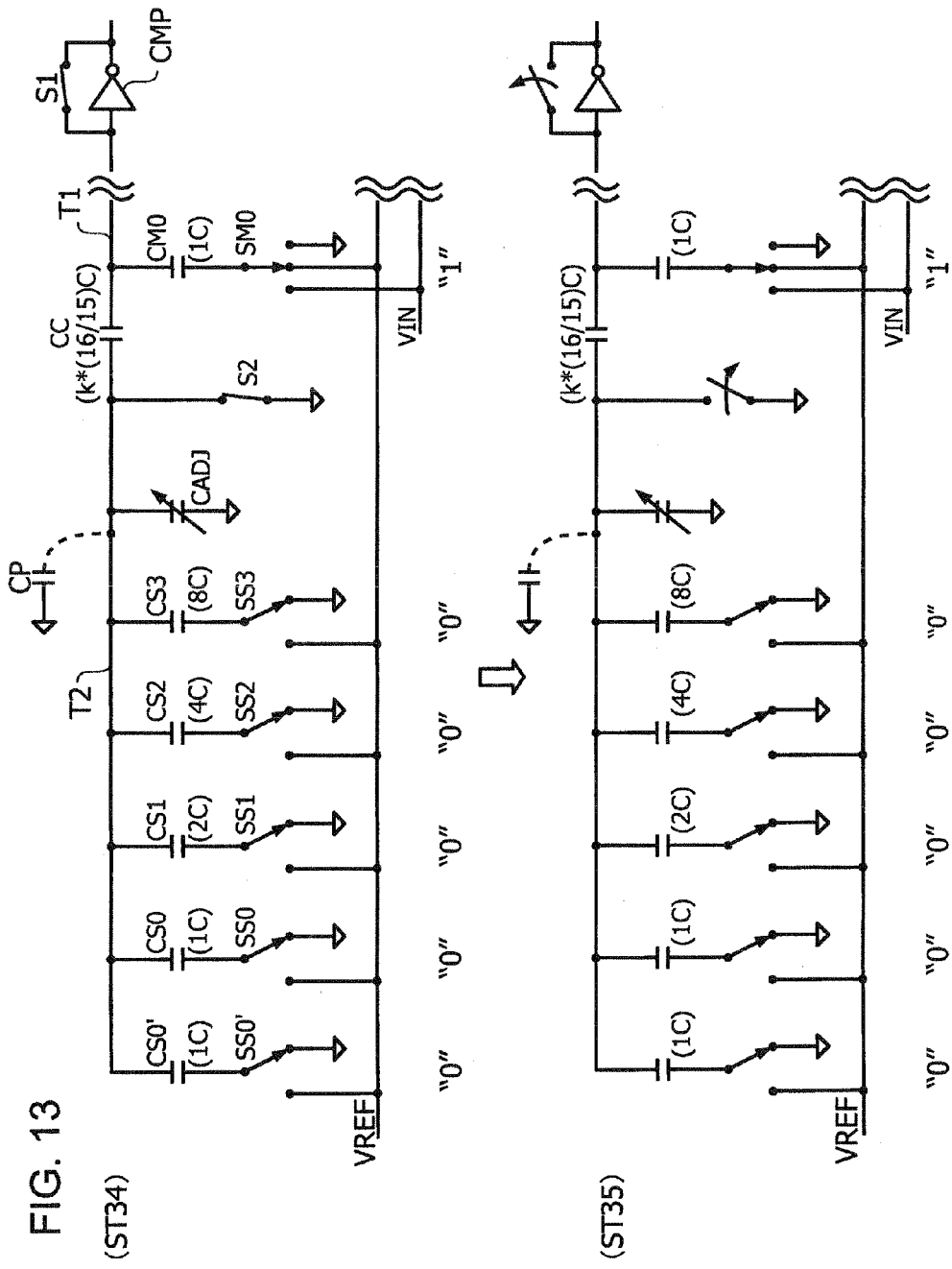
FIG. 13 illustrates a second procedure for adjusting the adjustable capacitor CADJ in an A/D converter having the capacitive main DAC and the capacitive sub-DAC.

FIG. 13 illustrates a second procedure for adjusting the adjustable capacitor CADJ in an A/D converter having the capacitive main DAC and the capacitive sub-DAC. Steps of measuring the adjustment value of the adjustable capacitor CADJ according to the second procedure are as follows. In FIG. 11, (ST21) S1,S2: ON, SM0: "1"=VREF, SS0', SS0'to SS3: "0"=GND
(ST22) S1,S2: OFF, SM0: "0"=GND, SS0', SS0'to SS3: "1"=VREF
(ST23) Search Dadj_a with which the potential of T1 becomes closest to VREF/2(=Vt). In FIG. 13,
(ST34) S1,S2: ON, SM0: "1"=VREF, SS0', SS0'to SS3: "0"=GND
(ST35) S1,S2 OFF, SM0: "1"=VREF, SS0', SS0'to SS3: "0"=GND
(ST36) Search Dadj_b with which the potential of T1 becomes closest to VREF/2(=Vt)
(ST37) Compute Dadj_a-Dadj_b, Dadj_a-Dadj_b becomes a true adjustment value after the offset is removed.

In the above measurement steps, the switches SM1 to SM3 of the main DAC are maintained in either VREF or GND.

In this procedure, the control circuit 10 performs the measurement depicted in FIG. 11, and obtains the adjustment value Dadj_a of the adjustable capacitor CADJ in the first stage in advance (ST21 to ST23).

Then the control circuit 10 performs adjustment depicted in FIG. 13. First S1 and S2 are connected, and the node T1 is biased to the threshold Vt (=VREF/2) of the comparator CMP, and the node T2 is biased to 0 V (ST34).

Then the switches S1 and S2 are opened, and the switch group in the bottom of the capacitive elements is not changed (ST35). Thereby the node T1 changes for the potential corresponding to the offset component. Here the control circuit 10 searches the adjustment data Dadj_b with which the node T1 approximates to the threshold Vt (ST36). The setting data Dadj_b of the CADJ has a component having only the influence of the offset.

If the adjustment value Dadj_b having only the influence of the offset obtained in the adjustment of the second stage is subtracted from the adjustment value Dadj_a including the offset obtained in the adjustment of the first stage, a true adjustment value Dadj' can be obtained. If the adjustable capacitor CADJ is adjusted using the obtained adjustment value Dadj' and A/D conversion is executed, a capacitance adjustment, in which offset is removed, can be performed.

The second procedure may be as follows. In FIG. 12,
(ST24) S1,S2: ON, SM0: GND, SS0', SS0'to SS3: VREF
(ST25) S1,S2: OFF, SM0: VREF, SS0', SS0'to SS3: GND
(ST26) Search Dadj_a with which the potential of T1 becomes closest to VREF/2 (=Vt), and in FIG. 13,
(ST34) S1,S2: ON, SM0: VREF, SS0', SS0'to SS3: GND
(ST35) S1,S2: OFF, SM0: VREF, SS0', SS0'to SS3: GND
(ST36) Search Dadj_b with which the potential of T1 becomes closest to VREF/2 (=Vt),
(ST37) Compute Dadj_a-Dadj_b, Dadj_a-Dadj_b becomes a true adjustment value after the offset is removed.

In the above measurement steps, the switches SM1 to SM3 of the main DAC are maintained in either VREF or GND.

In other words, the procedure in FIG. 11 and FIG. 13 may be performed, or the procedure in FIG. 12 and FIG. 13 may be performed.

In the second procedure, the procedure in FIG. 13 may be performed as follows.
(ST34) S1,S2: ON, SM0: GND, SS0', SS0'to SS3: VREF
(ST35) S1,S2: OFF, SM0: GND, SS0', SS0'to SS3: VREF
(ST36) Search Dadj_b with which the potential of T1 becomes closest to VREF/2 (=Vt)
(ST37) Compute Dadj_a-Dadj_b, Dadj_a-Dadj_b becomes a true adjustment value after the offset is removed.

In other words, in FIG. 13, the switch group SM0, SS0' and SS0'to SS3 may be connected to voltages opposite that of the procedure described above.

In the measurement in FIG. 13, the connection destinations of the switch groups SM0, SS0' and SS0'to SS3 do not influence the measurement result, so it is sufficient if the switch group is connected to either VREF or ground GND.

[Variation of Second Embodiment]

Figure 14:
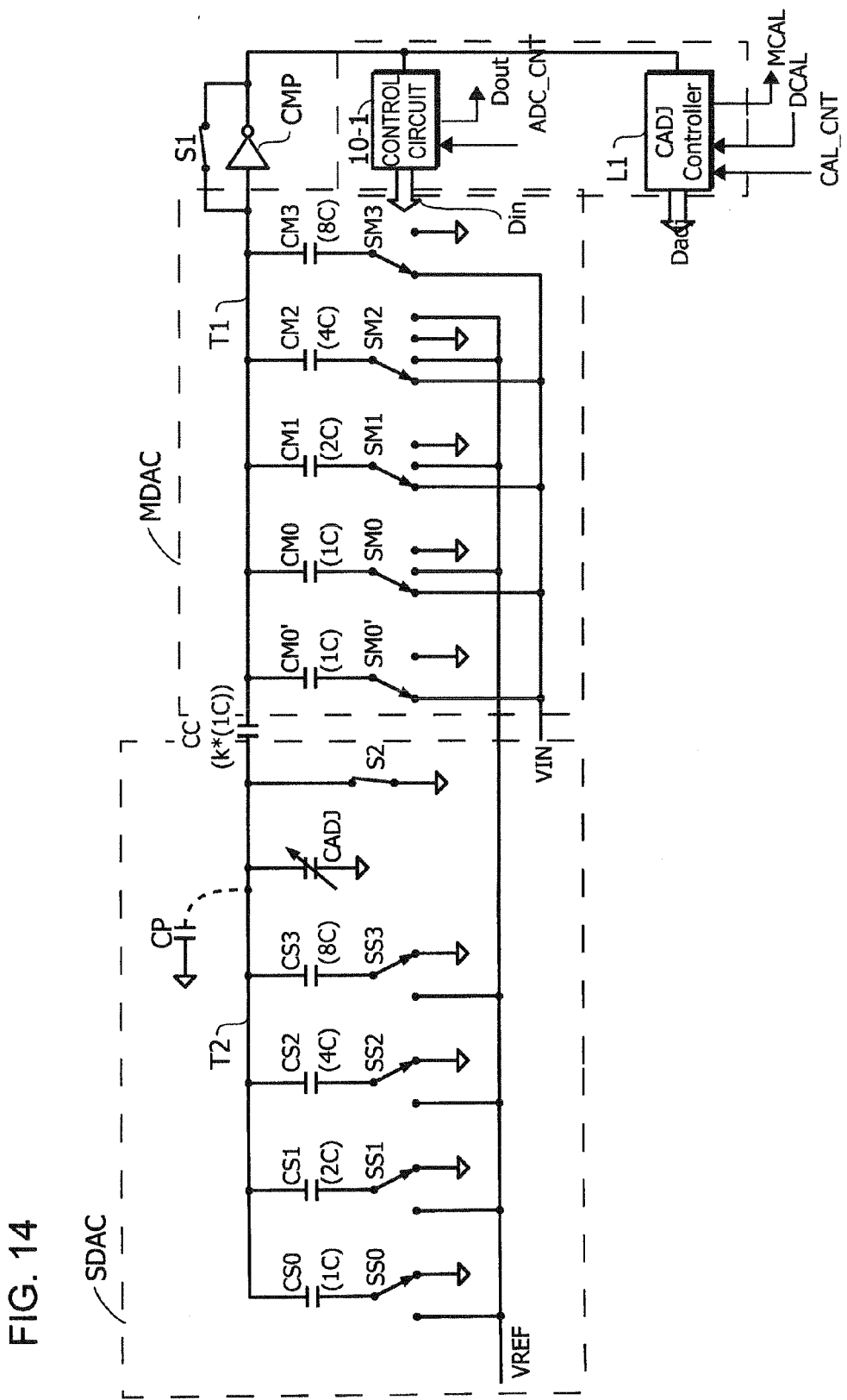
FIG. 14 illustrates a successive approximation A/D converter having a capacitive main DAC and a capacitive sub-DAC.

FIG. 14 illustrates a successive approximation A/D converter having a capacitive main DAC and a capacitive sub-DAC. In this A/D converter, the capacitive main DAC (MDAC) has a capacitive element CM0' having capacitance value 1C, in addition to the capacitive elements CM0 to CM3. The capacitive sub-DAC (SDAC) has capacitive elements CS0 to CS3, and the capacitance of the coupling capacitance CC is k times that of 1C. In other words, the A/D comparator in FIG. 14 is equivalent to the A/D converter in FIG. 3, wherein the capacitive element C0' and sub-DAC (SDAC) in FIG. 3 are replaced with the capacitive element CM0', the capacitive sub-DAC (SDAC) and the coupling capacitor CC for transferring the voltage of the node T2. In node T2, the voltage VSUB of the sub-DAC of FIG. 3 is generated.

The A/D converter in FIG. 14 is also equivalent to the A/D converter in FIG. 10 where the capacitive elements CS0' and SS0' in FIG. 10 are removed, and the capacitive elements CM0' and SM0' are added. In FIG. 14, the capacitance of the coupling element CC can be k times that of 1C. Hence the capacitor elements have values which are in an integral ratio, and all the capacitive elements can be implemented by a combination of capacitive elements having a single form.

The capacitive elements CS0' and SS0' in FIG. 10 have a weight of the least significant bit in the entire 8-bit DAC, but this does not cause any functional problems for A/D conversion, since the capacitive elements CS0 and SS0' in FIG. 14 also have a same weight of the least significant bit.

In the A/D converter in FIG. 14 as well, the capacitance value of the coupling capacitor CC is set to be k (>1) times that of 1C, and the adjustable capacitor CADJ is disposed, in order to eliminate the influence of the parasitic capacitance CP in the node T2 of the sub-DAC. The method for determining the value of the adjustment value Cadj of the adjustable capacitor CADJ is the same as above. The method for removing the offset component which is generated upon operating the switches S1 and S2 from ON to OFF is also the same as above.

Figure 15:
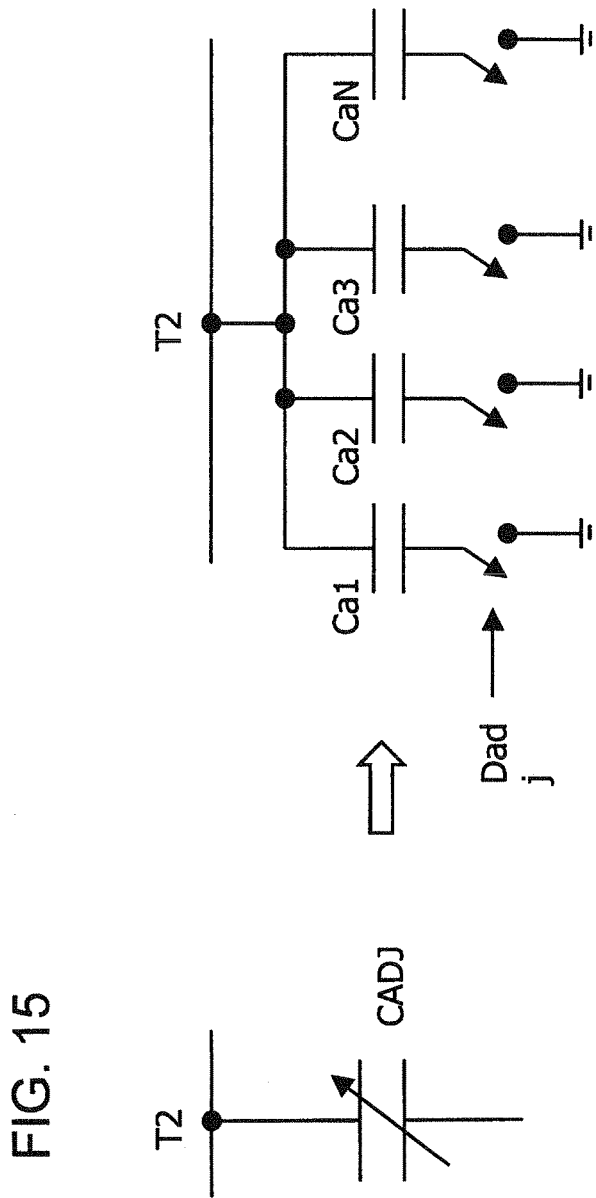
FIG. 15 is a concrete circuit diagram of the adjustable capacitor CADJ.

FIG. 15 is a concrete circuit diagram of the adjustable capacitor CADJ. As FIG. 15 depicts, the capacitive element CADJ, in the case of N bits, has N number of capacitive elements Ca1 to CaN in parallel, and the top nodes thereof are commonly connected to the node T2, and the bottom nodes thereof are connected to the respective switches. According to the adjustment code Dadj, these switches are connected to the ground GND (Dadj=1) or are opened (Dadj=0) so as to be controlled to a capacitance value in accordance to the adjustment code Dadj.

In the successive approximation A/D converter having a capacitive main DAC and a capacitive sub-DAC as well, the comparator CMP constituted by an invertor and the switch SW can be replaced with a comparison circuit for comparing the threshold voltage Vt and the top node TOP, and a switch for connecting the top node TOP to the threshold voltage Vt. The reference voltage VREF and the ground GND may be the appropriate two reference voltages, VREF+ and VREF−, between the power supply voltage and the ground. In this case, it is preferable that the threshold voltage Vt is (VREF++VREF−)/2.

[Third Embodiment]

A successive approximation A/D converter according to a third embodiment has the correction DAC of the first embodiment for correcting an error of a capacity pair to be balanced in the capacitive main DAC, in addition to the capacitive main DAC, the capacitive sub-DAC, the coupling capacitor CC and the adjustable capacitor CADJ of the second embodiment. A control circuit 10 detects a correction code along with an adjustment code, and outputs the detected adjustment code and the correction code when A/D conversion is performed.

In FIG. 10 and FIG. 14, the successive approximation A/D converter of the third embodiment has the correction DAC (resistors RO to R31 between the GND and VREF and the switch group SCAL), and the output voltage VCAL of the correction DAC is supplied to the top node T1 via a capacitive element corresponding to the least significant bit of the main DAC.

[Differential Configuration]

Figure 16:
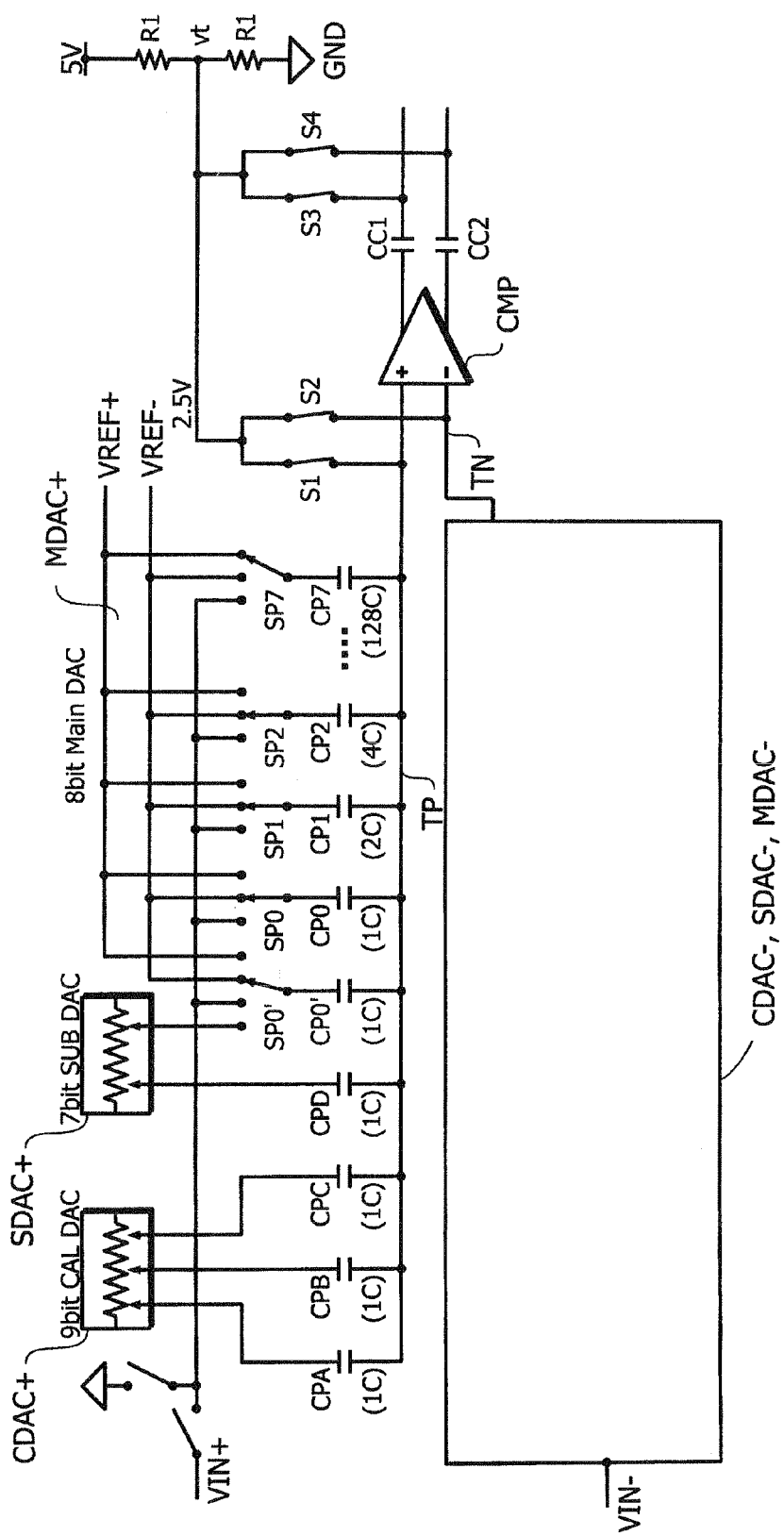
FIG. 16 illustrates a 15-bit self-correcting successive approximation A/D converter having the differential configuration according to the first embodiment.

FIG. 16 illustrates a 15-bit self-correcting successive approximation A/D converter having the differential configuration according to the first embodiment. In FIG. 16, only the positive side circuits are depicted, and the negative side circuits are omitted. In the A/D converter having the differential configuration as well, the correction errors due to comparator offset can be suppressed by using the procedure described in the first embodiment.

In FIG. 16, VIN+ indicates a positive side analog input voltage and node thereof, VIN− indicates a negative side analog input voltage and node thereof, CPA, CPB, CPC, CPD, CP0' and CP0 to CP7 indicate capacitive elements, CC1 and CC2 indicate capacitive elements, MDAC+ indicates an 8-bit capacitive main DAC, SDAC+ indicates a 7-bit resistive sub-DAC and CDAC+ indicates a 9-bit resistive correction DAC. SP0' and SP0 to SP7 indicate switches, S1 to S4 indicate switches, VREF+ indicates a positive side reference voltage and node thereof, VREF− indicates a negative side reference voltage and node thereof, CMP indicates a differential comparator and TP indicates a node. A node of each capacitive element on the TP side is a top node, and a node on the opposite side is a bottom plate. The resistive sub-DAC (SDAC+) supplies 4-bit and 3-bit voltage to the node TP via the capacitive elements CP0' and CPD. The corrective DAC (CDAC+) supplies 3-bit voltage to the node TP via the capacitive element CPA, CPB and CPC respectively. Upon sampling, both inputs of the comparator become a common voltage (threshold) Vt=5/2 V separated by the resistor R1 by turning the switches S1 and S2 ON.

The negative side, just like the positive side, has a capacitive main DAC (MDAC-), a resistive sub-DAC (SDAC-) and a resistive correction DAC (CDAC-).

In the A/D converter having this differential configuration, self correction is performed on the positive side and the negative side respectively. For example, in order to measure an error of the capacitive element CP2 and the complementary capacitive elements CP0', CP0 and CP1, the switches in the more significant bits, than the switch SP2, are fixed, the switch SP2 of the capacitive element CP2 is connected to VREF+, and the switches SP0', SP0 and SP1 of the complementary capacitive elements are connected to VREF−, so as to connect (turn ON) the switches S1 to S4. As a result, both the nodes TP and TN are biased to the threshold Vt=2.5 V generated by the resistor R1.

Next the switches S1 to S4 are opened (turned OFF) and the switches SP0' and SP0 to SP2 are inverted. Then the potential difference according to the capacitance difference between CP2 and CP1+CP0+CP0' is generated in the node TP. The correction DAC (CDAC+) is operated so that this potential change becomes zero, and the capacitance error is measured. This is the same as the case of the above mentioned single end A/D converter.

The capacitance error is measured in the same manner on the negative side as well.

In the example in FIG. 16, the output offset of the comparator CMP is stored in the output capacitors CC1 and CC2 of the comparator CMP while connecting the switches S1 to S4, and in the comparison stage where the switches S1 to S4 are opened, the A/D converter operates so as to cancel the offset. When the switches S1 and S4 are opened, electric charges are injected from the switches, but it is designed so that the electric charges to be injected into the positive side and the negative side become approximately the same, therefore compared with the case of a single end, the negative influence of the switches on the offset can be relaxed. However it is impossible to perfectly match the influence of the electric charge injection by the switches S1 and S2, and that by the switches S3 and S4, and the offset does not become completely zero. As a consequence, the above mentioned procedure of measuring capacitance error with removing the offset is effective.

In the example in FIG. 16, the weight of one LSB of the correction DAC (CDAC) is ¼ that of one LSB of the A/D conversion, and corresponds to the voltage that is 1/65536 of the reference potential difference (VREF+−VREF−). This means that ¼ of one LSB is 76 µV, which is very small, if the reference voltage VREF+ is 5 V and VREF− is 0 V. In the case of determining such a very small voltage, even a minor offset affects the result.

Therefore the above mentioned two types of error measurement are performed, and an error value after removing the offset is calculated based on the obtained two error measurement results. By correcting the A/D converter using the obtained error value, high precision A/D conversion can be implemented.

In the case of the successive approximation A/D converter having the capacitive main DAC, the capacitive sub-DAC, the coupling capacitive element CC and the adjustable capacitive element described in the second embodiment as well, the differential configuration can be used, just like FIG. 16. In such a differential configuration, just like FIG. 16, the control circuit determines the capacitance error after removing the offset on the positive side and the negative side respectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

What is claimed is:

1. A successive approximation A/D converter, comprising:
    a main DAC including a capacitive element group of which one electrode is coupled to a top node and is weighted with a power of 2, and a switch group by which the other electrode of the capacitive element group is coupled to an analog input terminal upon sampling, or is coupled to either a first reference voltage or a second reference voltage upon A/D conversion;
    a comparator which compares voltage of the top node of the main DAC with comparison reference voltage;
    a correction DAC which generates correction voltage in accordance with a capacitance error of a capacitive element pair to be balanced among the capacitive element group of the main DAC, and supplies the correction voltage to the top node of the main DAC; and
    a control circuit which generates internal digital input for controlling the switch group of the main DAC and a correction code for controlling the correction voltage of the correction DAC, and outputs a successive approximation result by the comparator from a significant bit to an insignificant bit when the A/D conversion is performed, wherein
    the control circuit measures a first capacitance error and a second capacitance error of the capacitive element pair to be balanced by performing, twice complementarily, a switching control on the internal digital input corresponding to the capacitive element pair to be balanced, and determines an offset-removed capacitance error where an offset generated in the measurement based on the switching control is removed from the first capacitance error and the second capacitance error, by subtracting the first capacitance error from the second capacitance error.

2. The successive approximation A/D converter according to claim 1, wherein
    upon executing the switching control, the control circuit switches a first state, where the top node is coupled to the comparison reference voltage and a first capacitive element of the capacitive element pair to be balanced is coupled to the first reference voltage and a second capacitive element thereof is coupled to the second reference voltage, to a second state, where the top node is set to a floating state, the first capacitive element is coupled to the second reference voltage and the second capacitive element is coupled to the first reference voltage, and
    upon measuring the capacitance error, the control circuit detects the correction code with which the top node approximates to the comparison reference voltage in the second state.

3. The successive approximation A/D converter according to claim 1, further comprising a sub-DAC which supplies insignificant bit voltage generated by dividing the first and second reference voltages to the top node of the main DAC via a capacitive element having a capacitance value of the least significant bit, upon A/D conversion of the insignificant bits.

4. The successive approximation A/D converter according to claim 3, wherein the correction DAC selects any of the insignificant bit voltages of the sub-DAC according to the correction code.

5. The successive approximation A/D converter according to claim 1, wherein
    the main DAC and the correction DAC are disposed both on a positive side and a negative side,
    the comparator detects the differential voltage of the top nodes of the positive side main DAC and the negative side main DAC, and compares the differential voltage with the comparison reference voltage, and
    the control circuit measures the correction code of the positive side main DAC and the correction code of the negative side main DAC respectively.

6. A successive approximation A/D converter, comprising:
    a main DAC having a first capacitive element group of which one electrode is coupled to a first top node and is weighted with a power of 2, and a first switch group by which the other electrode of the first capacitive element group is coupled to an analog input terminal upon sampling, or is coupled to either a first reference voltage or a second reference voltage upon A/D conversion;
    a sub-DAC having a second capacitive element group of which one electrode is coupled to a second top node and is weighted with a power of 2, and a second switch group by which the other electrode of the second capacitive element group is coupled to either a first reference voltage or a second reference voltage upon A/D conversion of the insignificant bits;
    a coupling capacitive element which couples the first top node and the second top node;
    a comparator which compares the voltage of the first top node of the main DAC with a comparison reference voltage;
    an adjustable capacitive element which is disposed in the second top node of the sub-DAC and which has a capacitance value being variably set according to a coupling degree of a voltage change of the second top node with the first top node of the main DAC; and
    a control circuit which generates internal digital input for controlling the first switch group and the second switch group, and an adjustment code for variable controlling the capacitance value of the adjustable capacitive element, and outputs a successive approximation result by the comparator from a significant bit to a insignificant bit when the A/D conversion is performed, wherein the control circuit measures a first coupling degree and a second coupling degree by performing, twice complementarily, a switching control on the internal digital input corresponding to the capacitive element, which corresponds to the least significant bit of the first capacitive element group, and the second capacitive element group, to determine an offset-removed coupling degree where an offset generated in the measurement based on the switching control is removed from the measured first coupling degree and second coupling degree, by subtracting the first coupling degree from the second coupling degree.

7. The successive approximation A/D converter according to claim 6, wherein upon executing the switching control, the control circuit switches a first state, where the first top node is coupled to the comparison reference voltage, a capacitive element corresponding to the least significant bit of the first capacitive element group is coupled to the first reference voltage, and the second capacitive element group is coupled to the second reference voltage, to a second state, where the first top node is set to a floating state, the capacitive element corresponding to the least significant bit of the first capacitive element group is coupled to the second reference voltage, and the second capacitive element group is coupled to the first reference voltage, and upon measuring the coupling degree, the control circuit detects the adjustment code with which the top node in the second state approximates to the comparison reference voltage.

8. The successive approximation A/D converter according to claim 6, wherein the main DAC, the sub-DAC, the coupling capacitive element and the adjustable capacitive element are disposed on the positive side and the negative side, the comparator detects the differential voltage of the first top nodes of the positive side main DAC and the negative side main DAC, and compares the differential voltage with the comparison reference voltage, and the control circuit measures the adjustment code on the positive side and the adjustment code on the negative side respectively.

9. The successive approximation A/D converter according to claim 6, further comprising a correction DAC which generates correction voltage in accordance with a capacitance error of a capacitive element pair to be balanced among the capacitive element group of the main DAC, and supplies the correction voltage to the top node of the main DAC, the control circuit generates a correction code for controlling the correction voltage of the correction DAC, and the control circuit determines an offset-removed capacitance error where an offset generated in the measurement based on the switching control is removed from the capacitance error of the capacitive element pair to be balanced, which is measured by performing switching control on the internal digital input corresponding to the capacitive element pair to be balanced.

\* \* \* \* \*